(12) United States Patent
You

(10) Patent No.: US 11,263,102 B2
(45) Date of Patent: Mar. 1, 2022

(54) MEMORY SYSTEM AND OPERATING METHOD THEREOF

(71) Applicant: SK hynix Inc., Icheon-si (KR)

(72) Inventor: Byoung Sung You, Seoul (KR)

(73) Assignee: SK hynix Inc., Icheon-si (KR)

( * ) Notice: Subject to any disclaimer, the term of this patent is extended or adjusted under 35 U.S.C. 154(b) by 322 days.

(21) Appl. No.: 16/696,396

(22) Filed: Nov. 26, 2019

(65) Prior Publication Data

US 2020/0233770 A1 Jul. 23, 2020

(30) Foreign Application Priority Data

Jan. 18, 2019 (KR) .................. 10-2019-0007072

(51) Int. Cl.
*G11C 16/34* (2006.01)
*G06F 11/30* (2006.01)
(Continued)

(52) U.S. Cl.
CPC ...... *G06F 11/3037* (2013.01); *G06F 9/30101* (2013.01); *G06F 11/076* (2013.01); *G06F 11/0772* (2013.01); *G11C 16/14* (2013.01); *G11C 16/26* (2013.01); *G11C 16/349* (2013.01); *G11C 16/3431* (2013.01); *G11C 29/50004* (2013.01)

(58) Field of Classification Search
CPC ............. G06F 11/3037; G06F 9/30101; G06F 11/076; G06F 11/0772; G06F 11/073; G06F 11/0754; G06F 11/0775; G06F 2201/81; G06F 11/3055; G06F 11/3058; G06F 11/1008; G06F 12/0246; G11C 16/14; G11C 16/26; G11C 16/349; G11C 29/50004; G11C 16/0483; G11C 29/024; G11C 29/52; G11C 29/44; G11C 29/76; G11C 16/12; G11C 5/147; G11C 29/028; G11C 16/3404; G11C 16/3431
See application file for complete search history.

(56) References Cited

U.S. PATENT DOCUMENTS

| 2013/0332769 A1* | 12/2013 | Parat ..................... G11C 16/16 714/6.13 |
| 2016/0217868 A1* | 7/2016 | Dutta ................... G11C 16/349 |
| 2021/0304828 A1* | 9/2021 | Kim ..................... G11C 16/10 |

FOREIGN PATENT DOCUMENTS

| KR | 100719380 B1 | 5/2007 |
| KR | 1020170069756 A | 6/2017 |

* cited by examiner

*Primary Examiner* — Jay W. Radke
(74) *Attorney, Agent, or Firm* — William Park & Associates Ltd.

(57) ABSTRACT

A memory system includes a status information register configured for checking threshold voltages of select transistors included in memory blocks, storing status information on a check result, and outputting a code based on the status information, a status monitor configured to receive the code from the status information register, determine a number of select transistors that have shifted according to the code, and output status signal based on the number of the select transistors that have shifted, and a central processing unit configured for outputting a setup command set for setting parameters of the memory blocks, outputting a re-program command set for re-programming the select transistors, or outputting a bad block address for processing the memory blocks as bad blocks in response to the status signals.

19 Claims, 19 Drawing Sheets

(51) Int. Cl.
*G06F 11/07* (2006.01)
*G11C 29/50* (2006.01)
*G11C 16/14* (2006.01)
*G11C 16/26* (2006.01)
*G06F 9/30* (2018.01)

FIG. 11
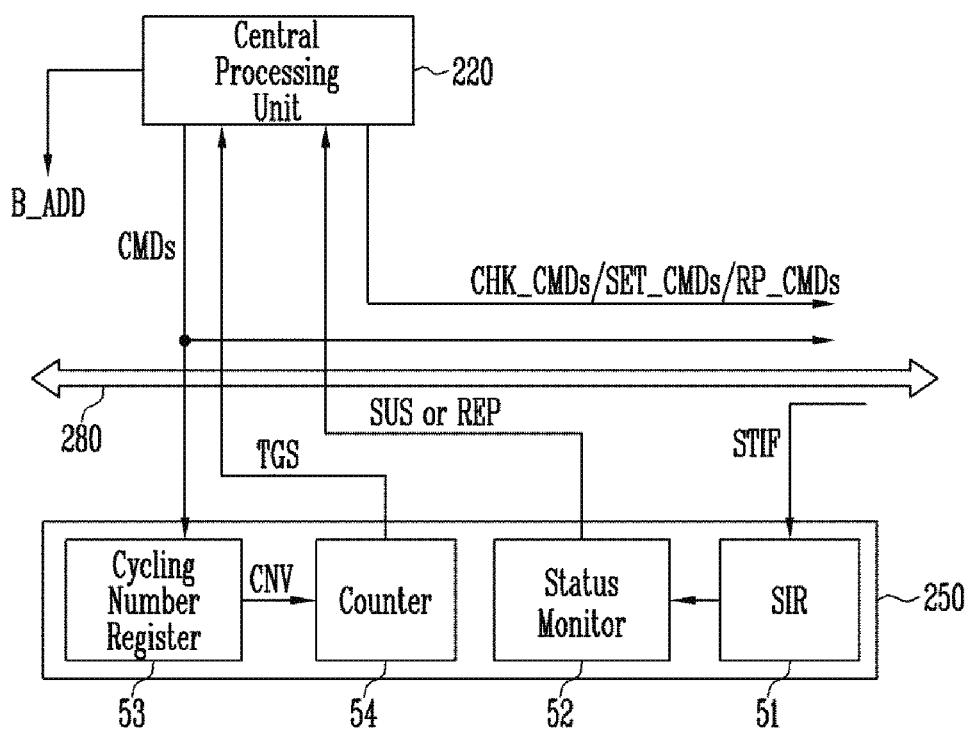
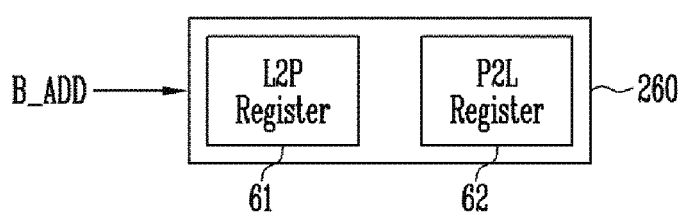

MEMORY SYSTEM AND OPERATING METHOD THEREOF

CROSS-REFERENCE TO RELATED APPLICATION

The present application claims priority under 35 U.S.C. § 119(a) to Korean patent application number 10-2019-0007072 filed on Jan. 18, 2019, the entire disclosure of which is incorporated herein by reference in its entirety.

BACKGROUND

1. Technical Field

Various embodiments relate generally to a memory system and an operating method thereof, and more particularly, to a memory system including select transistors and a method of operating the same.

2. Related Art

A memory system may include a storage device for storing data and a memory controller for controlling the storage device in response to a request from a host.

The storage device may include one or more other storage devices. Storage devices may be divided into volatile storage devices (volatile memory devices) and nonvolatile storage devices (nonvolatile memory devices) depending on whether stored data is lost when a power supply is blocked.

As portable electronic devices become more widespread, nonvolatile memory devices have come into a wider use. For example, nonvolatile storage devices are currently used in cellular phones, laptop computers, camcorders and sold state drives (SSDs).

A storage device may include a plurality of cell strings in which data is stored. The cell strings may be coupled between a bit line and a source line. Each of the cell strings may include at least one drain select transistor, at least one source select transistor and a plurality of memory cells. The drain select transistor may electrically couple or decouple the bit line and the memory cells, and the source select transistor may electrically couple or block the source line and the memory cells.

The drain select transistor and the source select transistor may be used in all operations of the storage device, including a program operation, a read operation and an erase operation. Particularly, in a verify operation which is performed during a program operation, or a read operation, threshold voltages of the memory cells may vary depending on turn-on levels of the drain select transistor and the source select transistor. Therefore, very high levels of reliability for electrical characteristics of the drain select transistor and the source select transistor are required.

SUMMARY

According to an embodiment, a memory system may include a status information register configured for checking threshold voltages of select transistors included in memory blocks, storing status information of a check result, and outputting a code based on the status information, a status monitor configured to receive the code from the status information register, determine a number of select transistors that have shifted in a memory block according to the code, and output status signals based on the number of the select transistors that have shifted, and a central processing unit configured for outputting a setup command set for setting parameters of the memory block, outputting a re-program command set for re-programming the select transistors of the memory block, or outputting a bad block address for processing the memory block as a bad block in response to the status signals.

According to an embodiment, a memory system may include a memory block including a first select transistor configured for coupling or decoupling a bit line with memory cells, a second select transistor configured for coupling or decoupling a source line with the memory cells, and a memory controller configured for storing information about threshold voltages of the first and second select transistors and controlling a parameter, a re-program operation, or a bad block processing operation of the memory block on the basis of the stored information.

According to an embodiment, a method of operating a memory system may include checking threshold voltages of select transistors, storing status information about the threshold voltages, outputting codes including bits that are grouped in units corresponding to memory blocks in the status information, determining shift statuses of the select transistors according to the codes, and performing a re-programming of select transistors, a re-setting of a parameter of a memory block, and a processing of a memory block as a bad block based on the shift statuses of the select transistors.

BRIEF DESCRIPTION OF THE DRAWINGS

FIG. 11 is a diagram illustrating the configuration of a status manager and a method of operating the same;

DETAILED DESCRIPTION

Advantages and features of the present invention and methods for achieving them will be made clear from embodiments described below in detail with reference to the accompanying drawings. However, they may be embodied in different forms and should not be construed as limited to the embodiments set forth herein. Rather, these embodiments are provided so that this disclosure will be thorough and complete, and will fully convey the scope of the example embodiments to those skilled in the art.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as " . . . between," "immediately . . . between" or "adjacent to . . . " and "directly adjacent to . . . " may be construed similarly.

Hereinafter, exemplary embodiments of the present disclosure will be described in detail with reference to the accompanying drawings in order for those skilled in the art to be able to readily implement the technical spirit of the present disclosure.

Various embodiments of the present disclosure may provide a memory system and an operating method thereof which can improve the reliability of the memory system by detecting and storing threshold voltages of select transistors included in a storage device, and controlling parameters for various operations on the basis of stored information.

Figure 1:
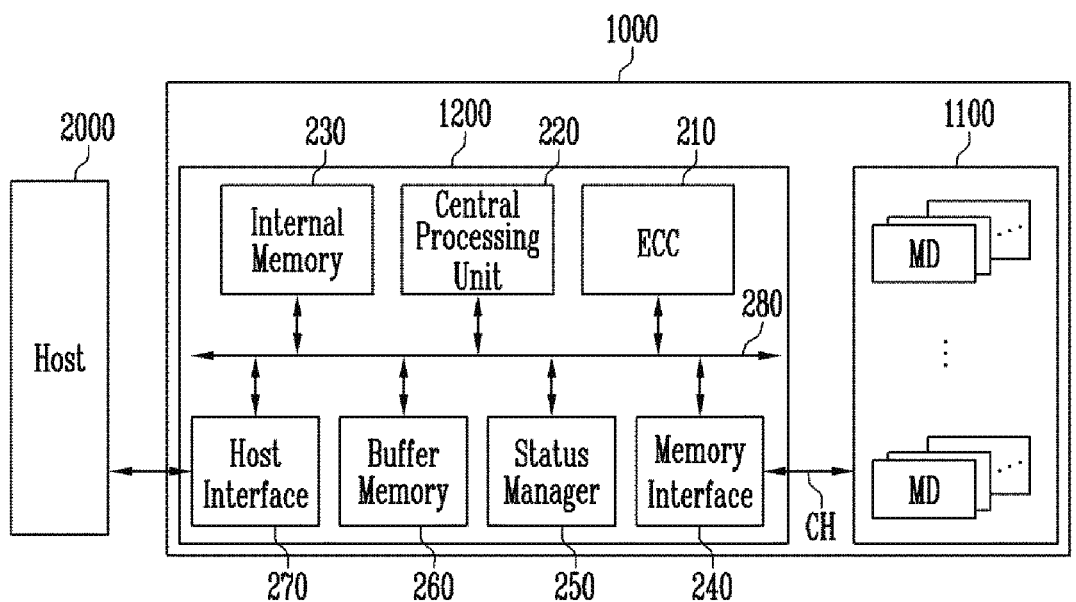
FIG. 1 is a diagram illustrating an embodiment of a memory system according to the present disclosure.
Figure 2:
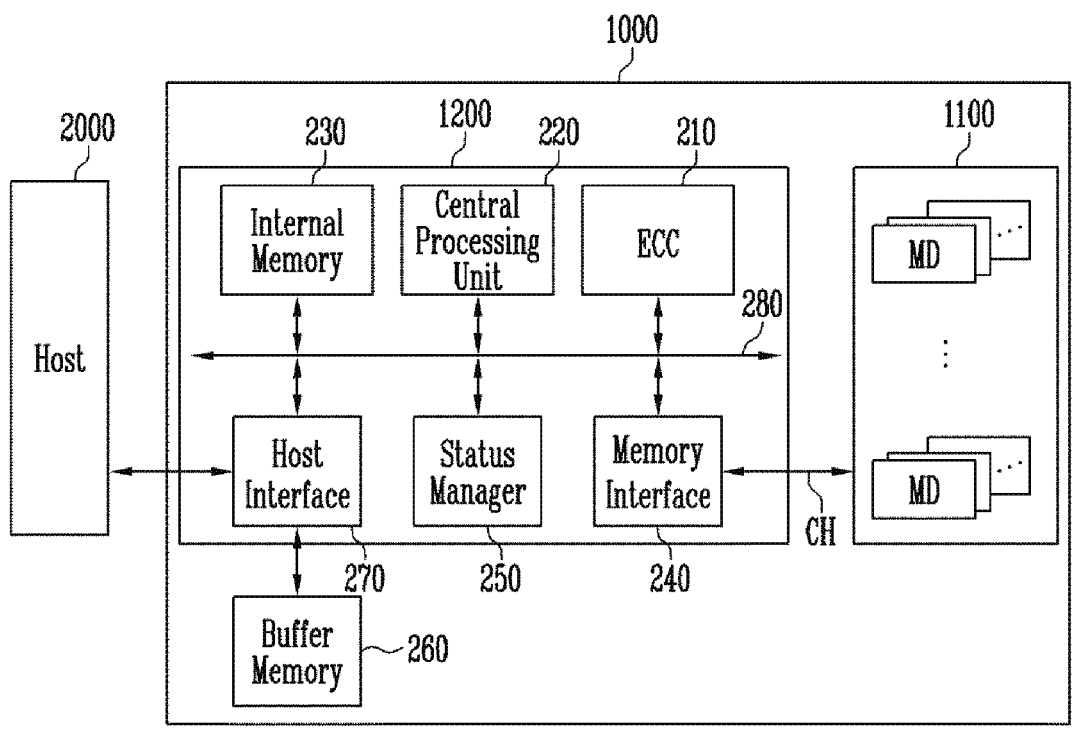
FIG. 2 is a diagram illustrating another embodiment of a memory system according to the present disclosure.

FIG. 1 is a diagram illustrating an embodiment of a memory system according to the present disclosure. FIG. 2 is a diagram illustrating another embodiment of a memory system according to the present disclosure.

Referring to FIG. 1, a memory system 1000 may include a storage device 1100 storing data and a memory controller 1200 controlling the storage device 1100 in response to control of a host 2000.

The host 2000 may communicate with the memory system 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-volatile Memory express (NVMe), Universal Flash Storage (UFS), Secure Digital (SD), Multi-Media Card (MMC), embedded MMC (eMMC), Dual In-line Memory Module (DIMM), Registered DIMM (RDIMM), and Load Reduced DIMM (LRDIMM) communication methods, etc.

The storage device 1100 may include a volatile memory device losing data when a power supply is blocked, or a non-volatile memory device retaining data even when a power supply is blocked. The storage device 1100 may include one or more memory devices MD performing a program operation, a read operation or an erase operation in response to control of the memory controller 1200. The memory devices MD may communicate with the memory controller 1200 through a plurality of channels CH. For example, the plurality of memory devices MD may be coupled to one channel CH. The plurality of channels CH may be coupled between the storage device 1100 and the memory controller 1200.

The memory devices MD may include a plurality of memory blocks, and each of the memory blocks may include a plurality of cell strings. The cell strings may be coupled between bit lines and a source line and include a plurality of select transistors and memory cells. For example, among the plurality of select transistors, first select transistors may electrically couple or block the bit line and the memory cells, and second select transistors may electrically couple or block the source line and the memory cells. The first select transistors may be drain select transistors and the second select transistors may be source select transistors. Since the select transistors may have the same structure as the memory cells, the select transistors may be programmed to have threshold voltages of a predetermined level for a switching operation. The word "predetermined" as used herein with respect to a parameter, such as a predetermined level, etc., means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The memory controller 1200 may control the general operations of the memory system 1000 and control data exchange between the host 2000 and the storage device 1100. For example, the memory controller 1200 may control the storage device 1100 to program, read or erase data in response to a request from the host 2000.

The memory controller 1200 may generate a command in response to requests received from the host 2000, or may perform various background operations for managing the memory system 1000 without requests from the host 2000. For example, the memory controller 1200 may perform background operations such as garbage collection and address map update. According to an embodiment, the memory controller 1200 may check threshold voltages of the select transistors included in the memory devices MD, store related information, and perform a background operation to control parameters related to operations of the memory devices MD on the basis of the stored information.

To perform the above-described operation, the memory controller 1200 may include an error correction component (ECC) 210, a central processing unit 220, an internal memory 230, a memory interface 240, a status manager 250, a buffer memory 260 and a host interface 270. In an embodiment, the error correction component (ECC) 210, central processing unit 220, internal memory 230, memory interface 240, status manager 250, buffer memory 260 and the host interface 270 may communicate with each other through a bus 280.

The ECC 210 may detect and correct errors in data during a program or read operation. For example, the ECC 210 may encode data received from the host 2000 during a program operation and decode data received from the memory device MD during a read operation. A low density parity check (LDPC) code may be used in encoding and decoding. An error correction operation using various types of codes other than LDPC does may be performed.

The central processing unit 220 may perform various arithmetic operations or generate a command or an address to control the storage device 1100. For example, the central processing unit 220 may generate a command at the request of the host 2000 and may autonomously generate a command for a background operation.

The internal memory 230 may temporarily store various types of data for operations of the memory controller 1200. For example, address mapping data read from the memory device MD may be stored in the internal memory 230.

The memory interface 240 may exchange a command, an address, and data between the memory controller 1200 and the storage device 1100. For example, the memory interface 240 may transfer a command, an address and data to the selected memory device MD through the channels CH, or may receive data from the selected memory device MD.

The status manager 250 may check threshold voltages of the select transistors included in the memory device MD and store the checked information. In addition, the status manager 250 may output a signal to the central processing unit 220 on the basis of the stored information so that the central processing unit 220 may output a command for changing or maintaining a parameter of the memory device MD.

The buffer memory 260 may serve as an operation memory or a cache memory of the memory controller 1200 and may store system data used in the memory system 1000. According to an embodiment, the buffer memory 260 may include Double Data Rate Synchronous Dynamic Random Access Memory (DDR SDRAM), DDR4 SDRAM, Low Power Double Data 4 (LPDDR4) SDRAM, Graphics Double Data Rate (GDDR) SDRAM, Low Power DDR (LPDDR), or Rambus Dynamic Random Access Memory (RDRAM), etc.

The memory interface 270 may exchange a command, an address, and data between the memory controller 1200 and the storage unit 2000. For example, the host interface 270 may communicate with the host 2000 by using an interface protocol such as Peripheral Component Interconnect Express (PCIe), Advanced Technology Attachment (ATA), Serial ATA (SATA), Parallel ATA (PATA), serial attached SCSI (SAS), or Non-Volatile Memory Express (NVMe), etc. In addition, the host interface 270 may include various interfaces such as a Universal Serial Bus (USB), a Multi-Media Card (MMC), an Enhanced Small Disk Interface (ESDI), and Integrated Drive Electronics (IDE), etc.

Referring to FIG. 2, according to an above-described embodiment, the buffer memory 260 may be included in the memory controller 1200. However, depending on the memory system 1000, the buffer memory 260 may be disposed outside the memory controller 1200 and exchange data with the memory controller 1200.

Figure 3:
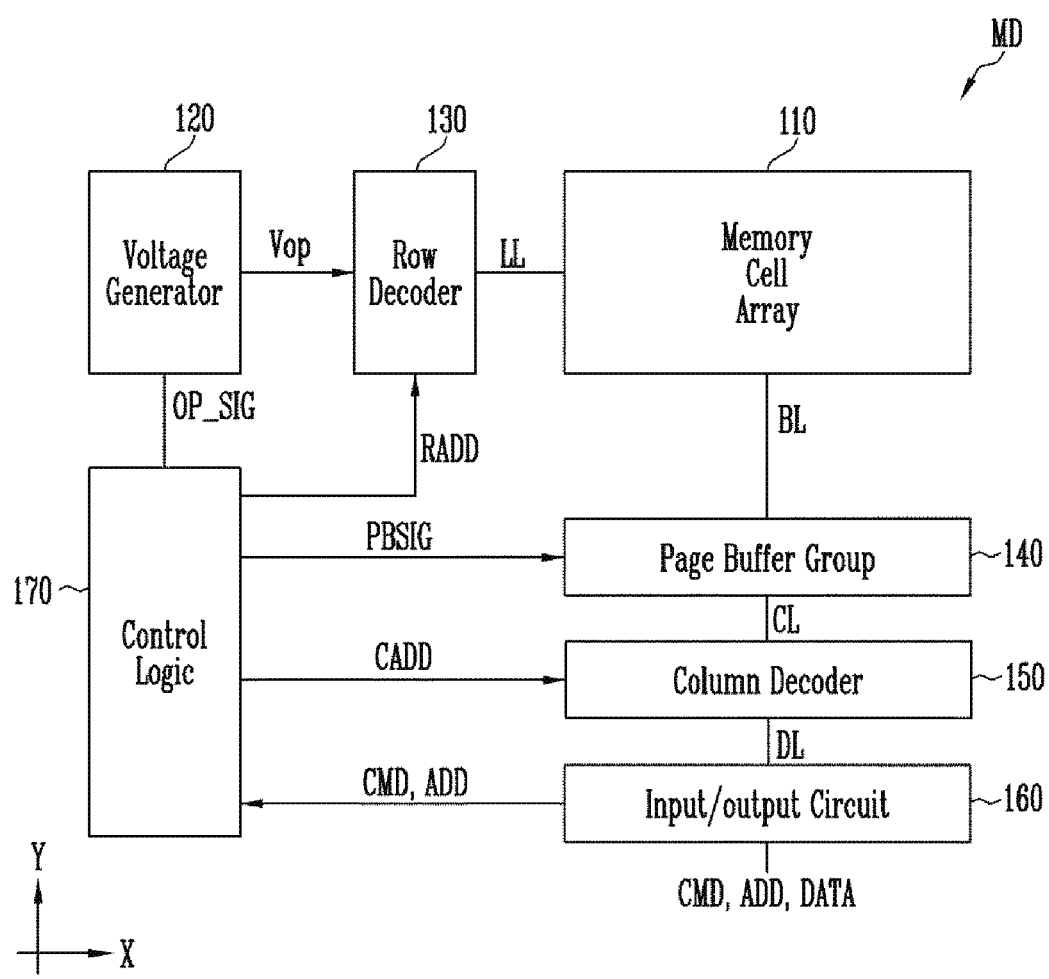
FIG. 3 is a diagram illustrating a memory device.

FIG. 3 is a diagram illustrating the memory device MD.

Referring to FIG. 3, the memory device MD may include a memory cell array 110, a voltage generator 120, a row decoder 130, a page buffer group 140, a column decoder 150, an input/output circuit 160 and a control logic 170.

The memory cell array 110 may include memory cells in which data is stored. The memory cells may have a two-dimensional structure in which the memory cells are arranged in parallel with the substrate, or a three-dimensional structure in which the memory cells are stacked in a vertical direction to the substrate. A plurality of memory cells may form a memory block and a plurality of memory blocks may form a plane.

The voltage generator 120 may generate and output operating voltages Vop for various operations in response to an operating signal OP_SIG. For example, the voltage generator 120 may generate and output a program voltage, a verify voltage, a read voltage, a pass voltage and an erase voltage.

The row decoder 130 may select one memory block according to a row address RADD and transfer the operating voltages Vop through local lines LL of the selected memory block.

The page buffer group 140 may include a plurality of page buffers coupled to bit lines BL and temporarily store data during a program or read operation in response to a page buffer control signal PBSIG. Each of the page buffers may include a plurality of latches designed for temporarily storing data during program, read and verify operations.

The column decoder 150 may be coupled to the page buffer group 140 through column lines CL and to the input/output circuit 160 through data lines DL. For example, the column decoder 150 may transfer data received through the data lines DL to the page buffer group 140 during a program operation, or may transfer data received through the column lines to the input/output circuit 160 during a read operation.

The input/output circuit 160 may be coupled to the memory controller 1200 through input/output lines and may input/output a command CMD, an address ADD and data DATA through the input/output lines. For example, during a program operation, the input/output circuit 160 may transfer the command CMD and the address ADD from the memory controller 1200 to the control logic 170, or may transfer the data DATA to the column decoder 150. During a read operation, the input/output circuit 160 may output the data DATA received from the column decoder 150 to the memory controller 1200. The control logic may output a column address CADD to the column decoder 150.

Figure 4:
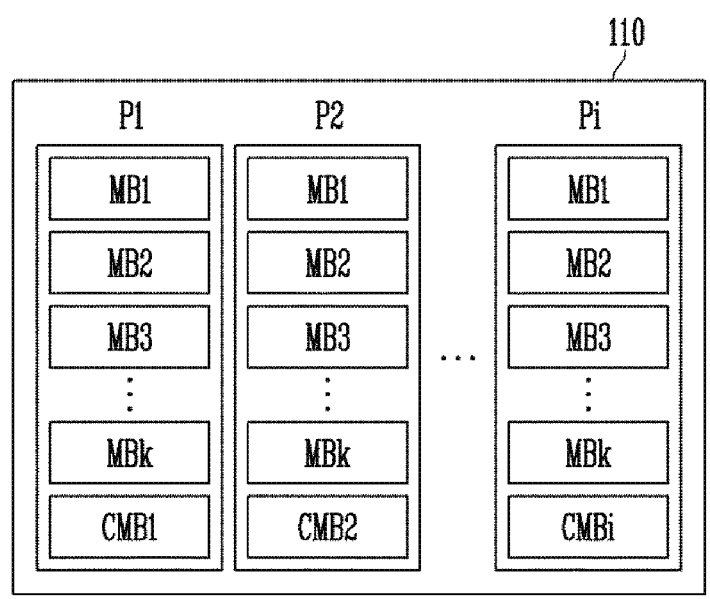
FIG. 4 is a diagram illustrating a memory cell array shown in FIG. 3.

FIG. 4 is a diagram illustrating the memory cell array 110 shown in FIG. 3.

Referring to FIG. 4, the memory cell array 110 may include a plurality of planes. For example, the memory cell array 110 may include first to ith planes P1 to Pi, where i is a positive integer. Each of the first to ith planes P1 to Pi may include a plurality of memory blocks. For example, each of the first to ith planes P1 to Pi may include first to kth memory blocks MB1 to MBk and at least one CAM memory block, where k is a positive integer. For example, the first to ith planes P1 to Pi may include first to ith CAM memory blocks CMB1 to CMBi, respectively. The first to kth memory blocks MB1 to MBk may be configured in the same manner as the first to ith CAM memory blocks CMB1 to CMBi.

The first to kth memory blocks MB1 to MBk may store normal data DATA and the first to ith CAM memory blocks CMB1 to CMBi may store system data for internal operations of the memory system 1000. For example, the normal data DATA may be input or output by a user, and the system data may include various parameters and address mapping information relating to operations of the memory device MD. The parameters may include various values with respect to levels of voltages used in program, read and erase operations and voltage applying time.

Figure 5:
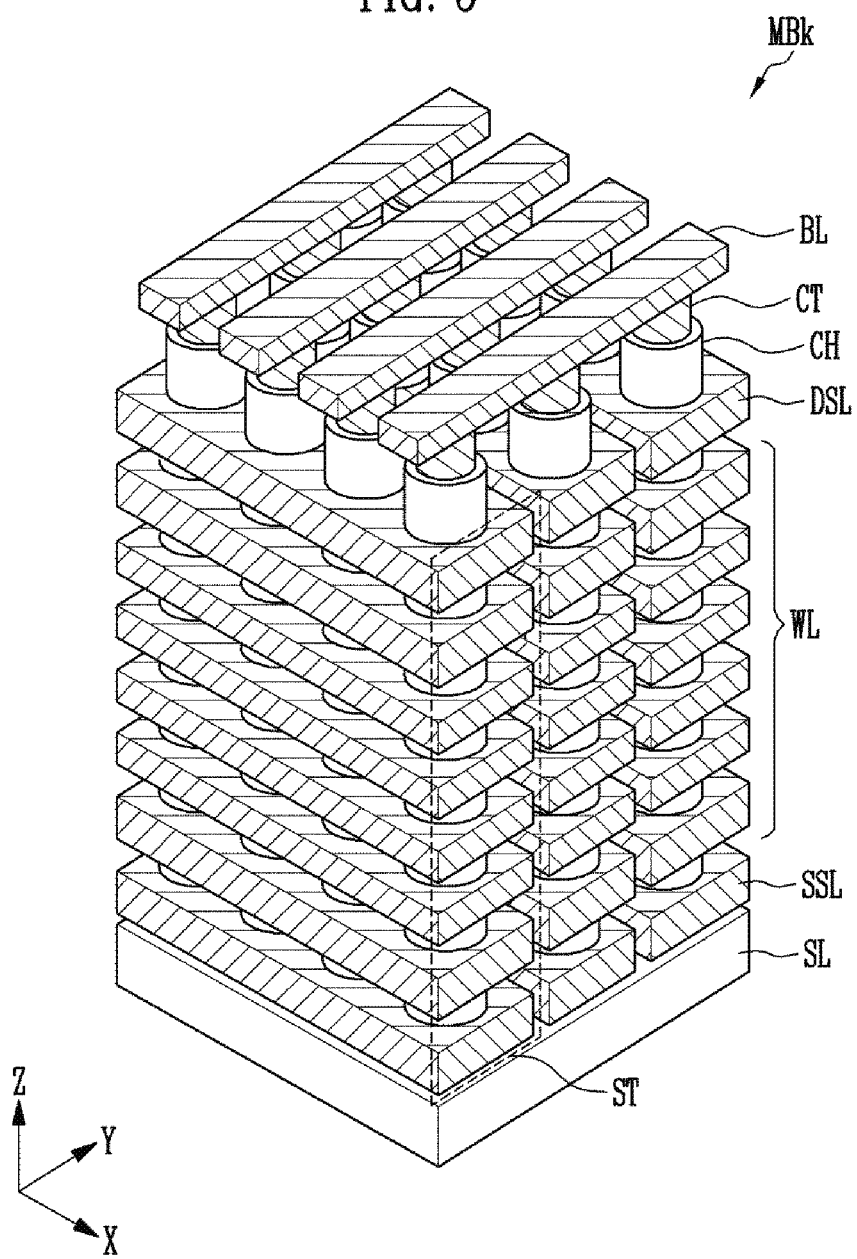
FIG. 5 is a diagram illustrating an embodiment of a three-dimensionally structured memory block of FIG. 4.

FIG. 5 is a diagram illustrating an embodiment of a three-dimensionally structured memory block of FIG. 4.

Referring to FIG. 5, the kth memory block MBk having a three-dimensional structure may have an I shape perpendicular (Z direction) to a substrate and include a plurality of cell strings ST arranged between the bit lines BL and a source line SL. Alternatively, a well may be formed instead of the source line SL. This structure may be referred to as a bit cost scalable (BiCS) structure. For example, when the source line SL is formed in a horizontal direction to the substrate, the cell strings ST having the BiCS structure may be formed in a vertical direction (Z direction) to a top of the source line SL.

For example, the cell strings ST may be arranged in a first direction (X direction) or a second direction (Y direction). The cell strings ST may include source select lines SSL, word lines WL, and drain select lines DSL stacked on and separated from each other. The numbers of source select lines SSL, word lines WL and drain select lines DSL may not be limited to those shown in FIG. 5 and may vary according to each memory device MD. The cell strings ST may further include vertical channel layers CH and the bit lines BL. The vertical channel layers CH may vertically pass through the source select lines SSL, the word lines WL and the drain select lines DSL. The bit lines BL may contact top portions of the vertical channel layers CH protruding above top portions of the drain select lines DSL and extend in the second direction (Y direction). Memory cells may be formed between the word lines WL and the vertical channel layers CH. Contact plugs CT may be further formed between the bit lines BL and the vertical channel layers CH.

Figure 6:
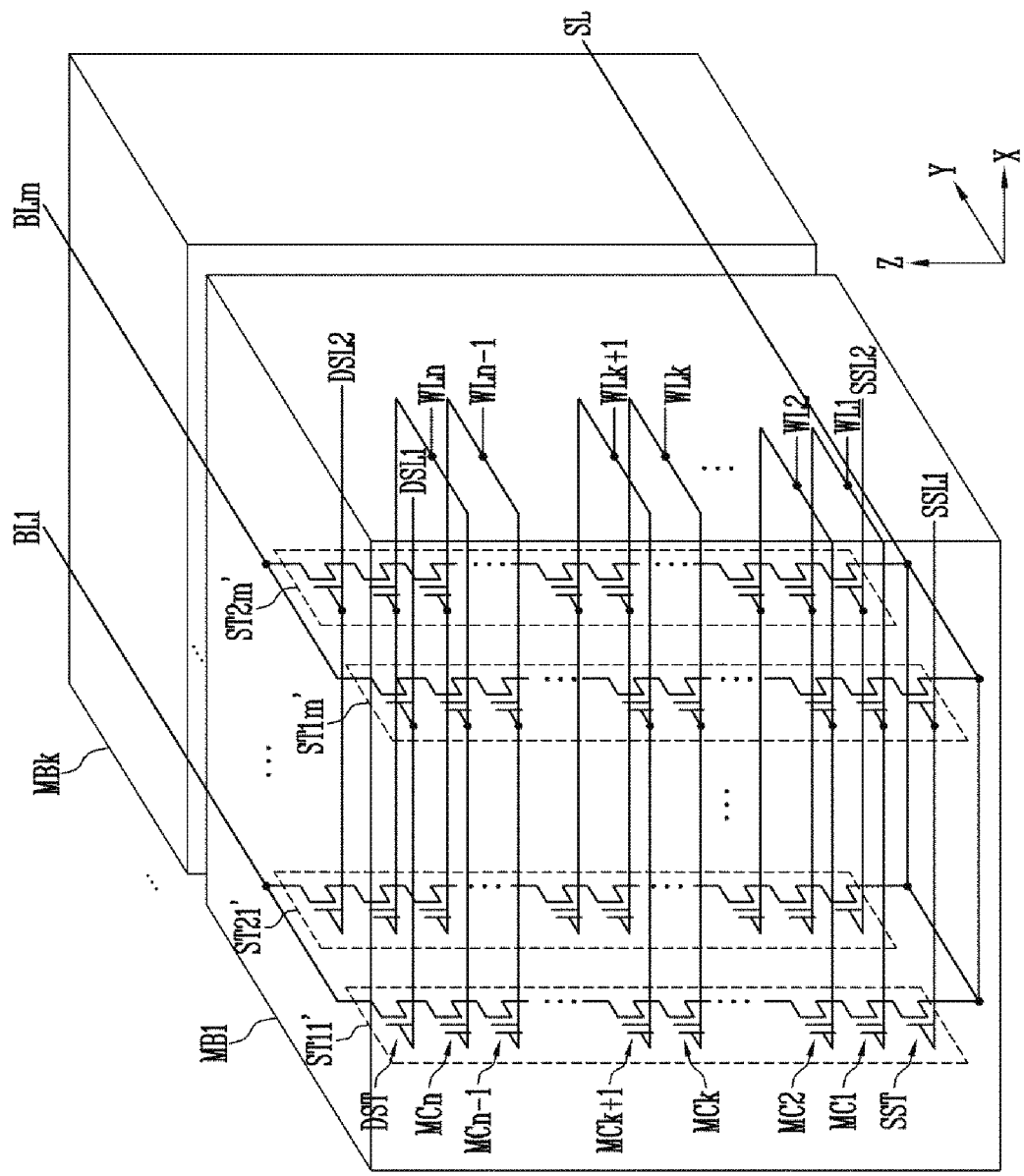
FIG. 6 is a circuit diagram illustrating a memory block shown in FIG. 5.

FIG. 6 is a circuit diagram illustrating the memory blocks shown in FIG. 5.

When the first memory block MB1 is described by way of example with reference to FIG. 6, the first memory block MB1 may include a plurality of cell strings ST11' to ST1m' and ST21' to ST2m'. Each of the plurality of cell strings ST11' to ST1m' and ST21' to ST2m' may extend in the vertical direction (Z direction) and 'm' cell strings may be arranged in a row direction (X direction) in the first memory block MB1. FIG. 6 illustrates two cell strings arranged in a column direction (Y direction) for convenience of explanation. However, three or more cell strings may be arranged in the column direction (Y direction).

Each of the plurality of cell strings ST11' to ST1m' and ST21' to ST2m' may include at least one source select transistor SST, first to nth memory cells MC1 to MCn and at least one drain select transistor DST.

The source select transistor SST of each of the cell strings may be coupled between the source line SL and the memory cells MC1 to MCn. The source select transistors SST of cell strings arranged in the same row may be coupled to the same source select line (SSL1 or SSL2). The source select transistors SST of the cell strings ST11' to ST1m' arranged in the first row may be coupled to a first source select line SSL1. The source select transistors SST of the cell strings ST21' to ST2m' arranged in the second row may be coupled to a second source select line SSL2. According to an embodiment, the source select transistors SST of the cell strings ST11' to ST1m' and ST21' to ST2m' may be coupled commonly to one source select line.

The first to nth memory cells MC1 to MCn of each of the cell strings may be coupled in series between the source select transistor SST and the drain select transistor DST. Gates of the first to nth memory cells MC1 to MCn may be coupled to first to nth word lines WL1 to WLn, respectively. In addition, at least one of the first to nth memory cells MC1 to MCn may serve as a dummy memory cell.

The drain select transistor DST of each of the cell string may be coupled between the corresponding bit line and the memory cells MC1 to MCn. The drain select transistors DST of cell strings arranged in the row direction may be coupled to a drain select line extending in the row direction. The drain select transistors DST of the cell strings ST11' to ST1m' arranged in the first row may be coupled to a first drain select line DSL1. The drain select transistors DST of the cell strings ST21' to ST2m' arranged in the second row may be coupled to a second drain select line DSL2.

Figure 7:
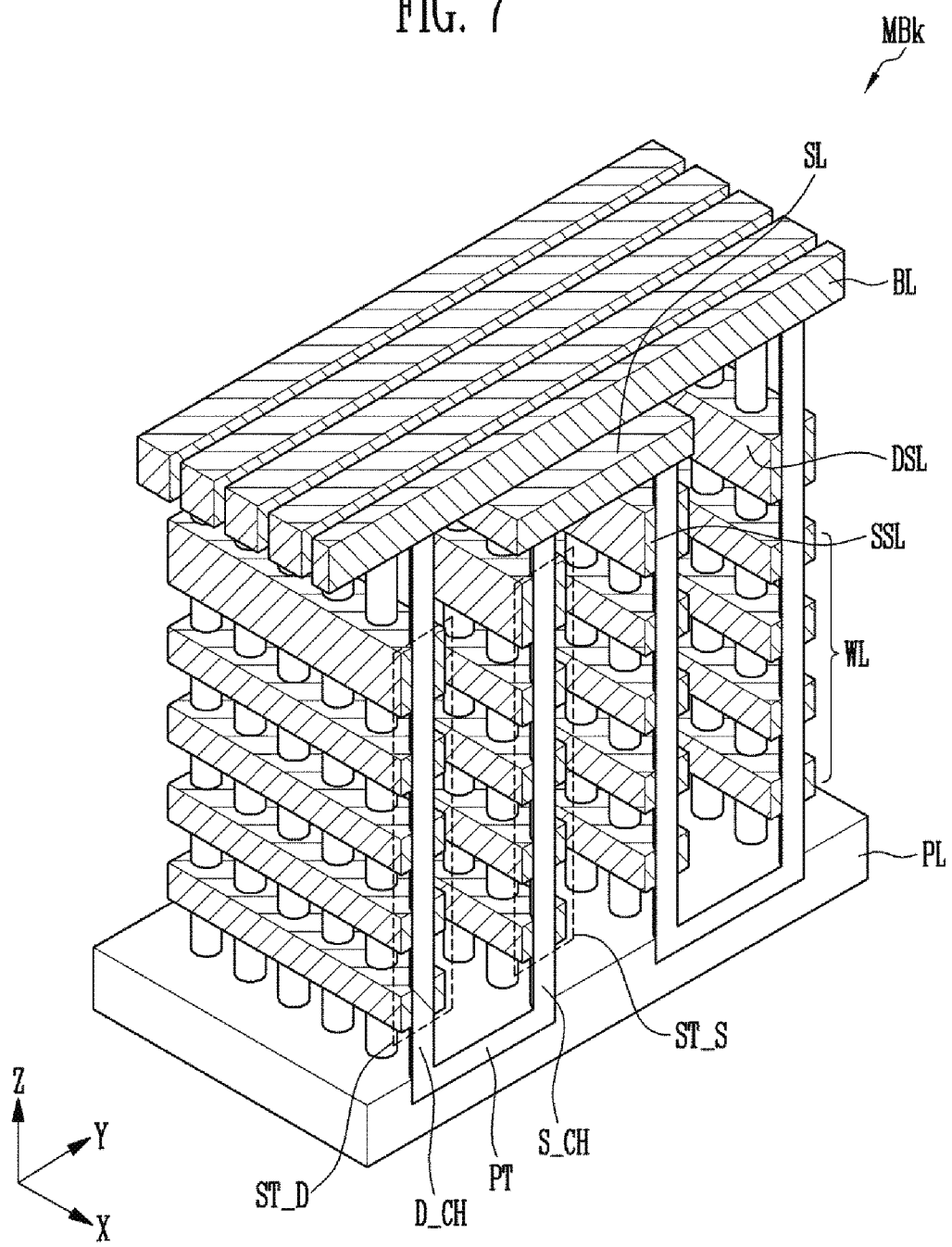
FIG. 7 is a diagram illustrating another embodiment of a three-dimensionally structured memory block of FIG. 4.

FIG. 7 is a diagram illustrating an embodiment of a three-dimensionally structured memory block of FIG. 4.

Referring to FIG. 7, the kth memory block MBk having a three-dimensional structure may have a U shape perpendicular (Z direction) to a substrate and include source strings ST_S and drain strings ST_D coupled in pairs between the bit lines BL and the source line SL. The source strings ST_S and the drain strings ST_D may be coupled to each other through a pipe transistor PT to form a U-shaped structure. The pipe transistor PT may be formed in a pipe line PL. More specifically, the source strings ST_S may be vertically formed between the source lines SL and the pipe line PL, and the drain strings ST_D may be vertically formed between the bit lines BL and the pipe line PL. This structure of the above cell string may be referred to as a Pipe-shaped Bit Cost Scalable (P-BiCS) structure.

For example, the drain strings ST_D and the source strings ST_S may be arranged in the first direction (X direction) and the second direction (Y direction), and the drain strings ST_D and the source strings ST_S may be alternately arranged in the second direction (Y direction). The drain strings ST_D may include the word lines WL and the drain select line DSL stacked on and separated from each other, and drain vertical channel layers D_CH vertically penetrating the word lines WL and the drain select line DSL. The source strings ST_S may include the word lines WL and the source select line SSL stacked on and separated from each other, and source vertical channel layers S_CH vertically penetrating the word lines WL and the source select line SSL. The drain vertical channel layers D_CH and the source vertical channel layers S_CH may be coupled to each other through the pipe transistor PT in the pipe line PL. The bit lines BL may contact top portions of the drain vertical channel layers D_CH protruding above the drain select line DSL and extend in the second direction (Y direction).

Figure 8:
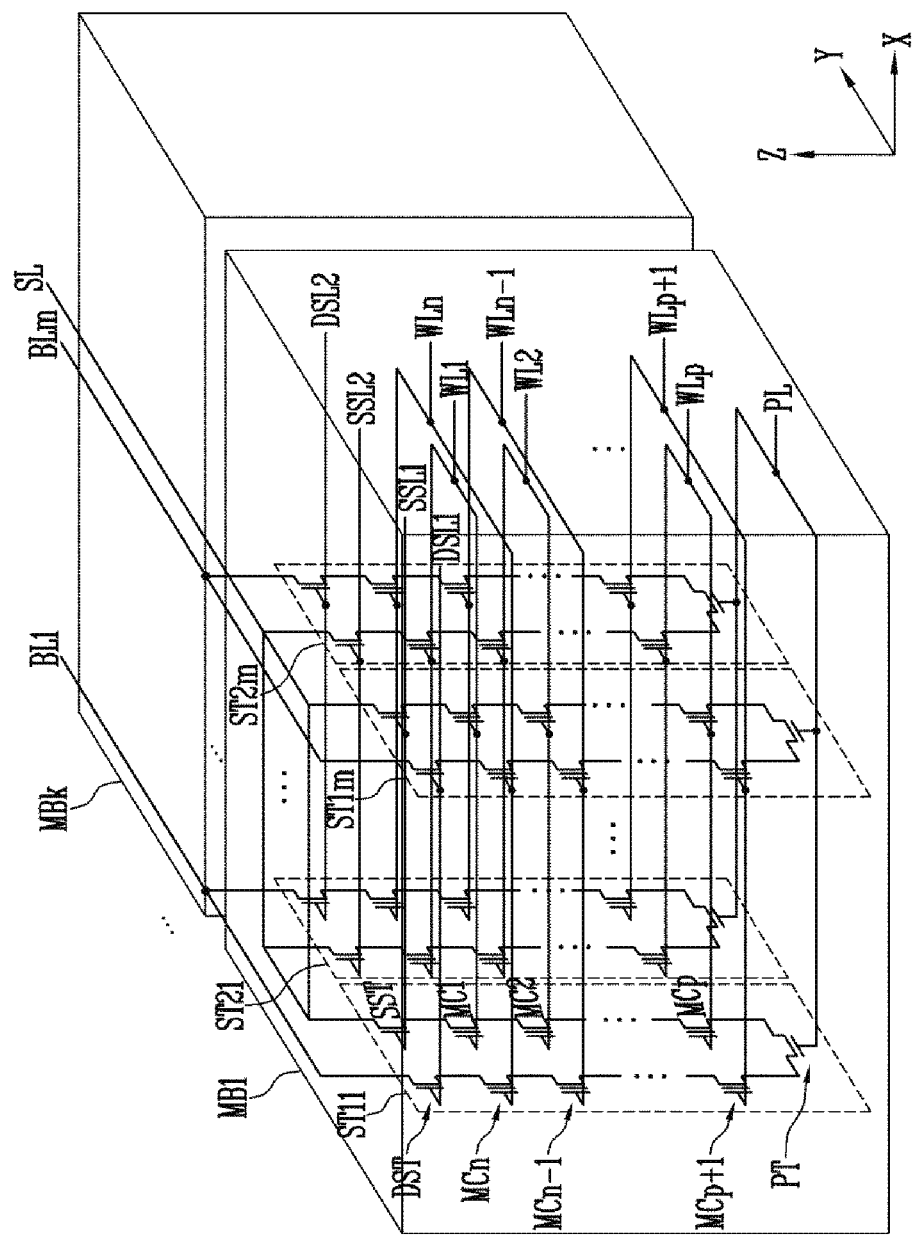
FIG. 8 is a circuit diagram illustrating a memory block shown in FIG. 7.

FIG. 8 is a circuit diagram illustrating the memory blocks shown in FIG. 7.

Referring to FIG. 8, the memory cell array 110 may include the plurality of memory blocks MB1 to MBk. When the first memory block MB1 is described by way of example, the first memory block MB1 may include a plurality of cell strings ST11 to ST1m and ST21 to ST2m. According to an embodiment, each of the cell strings ST11 to ST1m and ST21 to ST2m may be formed in a 'U' shape. In the first memory block MB1, 'm' strings may be arranged in a row direction (X direction). FIG. 8 illustrates two cell strings arranged in a column direction (Y direction) for convenience of explanation. However, three or more cell strings may be arranged in the column direction (Y direction).

Each of the plurality of cell strings ST11 to ST1m and ST21 to ST2m may include at least one source select transistor SST, the first to nth memory cells MC1 to MCn, a pipe transistor PT and at least one drain select transistor DST.

The source and drain select transistors SST and DST and the memory cells MC1 to MCn may have similar structures to each other. For example, each of the source and drain select transistors SST and DST and the memory cells MC1 to MCn may include a channel layer, a tunnel insulating layer, a charge trap layer, and a blocking insulating layer. For example, a pillar for providing a channel layer may be provided in each string. For example, a pillar for providing at least one of the channel layer, the tunnel insulating layer, the charge trap layer and the blocking insulating layer may be provided in each string.

The source select transistor SST of each of the cell strings may be coupled between the source line SL and the memory cells MC1 to MCp.

According to an embodiment source select transistors of strings arranged in the same row may be coupled to a source select line extending in a row direction, and source select transistors of cell strings arranged in different rows may be coupled to different source select lines. As shown in FIG. 8, the source select transistors SST of the cell strings ST11 to ST1m in the first row may be coupled to the first source select line SSL1. The source select transistors SST of the cell strings ST21 to ST2m arranged in the second row may be coupled to the second source select line SSL2.

In an embodiment, the source select transistors SST of the cell strings ST21 to ST2m may be coupled commonly to one source select line.

The first to nth memory cells MC1 to MCn of each of the cell strings may be coupled in series between the source select transistor SST and the drain select transistor DST.

The first to nth memory cells MC1 to MCn may be divided into the first to pth memory cells MC1 to MCp and (p+1)th to nth memory cells MCp+1 to MCn. The first to pth memory cells MC1 to MCp may be sequentially arranged in a vertical direction (Z direction) and be coupled in series between the source select transistor SST and the pipe transistor PT. The (p+1)th to nth memory cells MCp+1 to MCn may be sequentially arranged in the vertical direction (Z direction) and be coupled in series between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to the first to nth word lines WL1 to WLn, respectively.

According to an embodiment, at least one of the first to nth memory cells MC1 to MCn may serve as a dummy memory cell. When the dummy memory cell is provided, a voltage or current of the corresponding string may be stably controlled. A gate of the pipe transistor PT of each string may be coupled to the pipe line PL.

The drain select transistor DST of each string may be coupled between the corresponding bit line and the (p+1)th to nth memory cells MCp+1 to MCn. Strings arranged in the row direction may be coupled to the corresponding drain select line extending in the row direction. The drain select transistors DST of the cell strings ST11 to ST1m in the first row may be coupled to the first drain select line DSL1. The drain select transistors DST of the cell strings ST21 to ST2m in the second row may be coupled to the second drain select line DSL2.

Cell strings arranged in a column direction may be coupled to bit lines extending in the column direction. As illustrated in FIG. 8, the cell strings ST11 and ST21 in the first column may be coupled to a first bit line BL1. The cell strings ST1m and ST2m in the mth column may be coupled to an mth bit line BLm.

Memory cells coupled to the same word line, among strings arranged in the row direction, may form a single page. For example, memory cells coupled to the first word line WL1, among the cell strings ST11 to ST1m in the first row, may constitute one page. Among the cell strings ST21 to ST2m in the second row, memory cells coupled to the first word line WL1 may constitute one additional page. When one of the first and second drain select lines DSL1 and DSL2 is selected, cell strings arranged in one row direction may be selected. When one of the first to nth word lines WL1 to WLn is selected, one page may be selected from the selected cell strings.

Figure 9:
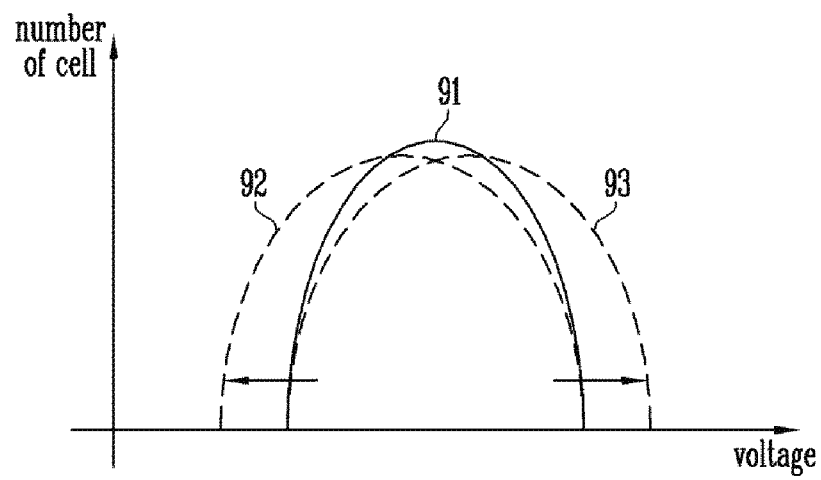
FIG. 9 is a diagram illustrating changes in threshold voltages of select transistors.

FIG. 9 is a diagram illustrating changes in threshold voltages of select transistors.

Referring to FIG. 9, select transistors such as the above-described drain and source select transistors may perform a switch function for coupling or decoupling a bit line or a source line and a cell string. Particularly, in a memory device including three-dimensionally structured memory blocks, select transistors may have the same structure as memory cells. Therefore, the select transistors may have a threshold voltage (91) at a predetermined level to perform a switch function.

However, as the number of times erase and program operations are performed on a memory block increases, i.e., as a cycling number increases, threshold voltages of the select transistors may be reduced due to a leakage current (92), or may be increased by interference of operating voltages (93).

However, when the threshold voltages of the select transistors are lower (92) or higher (93) than a normal threshold voltage (91), data of the memory cells may not be normally sensed during a verify operation or a read operation. As a result, reliability of the memory device may be deteriorated.

Figure 10:
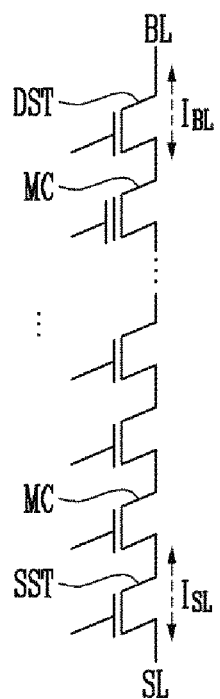
FIG. 10 is a diagram illustrating reliability degradation caused by changes in threshold voltages of select transistors.

FIG. 10 is a diagram illustrating reliability degradation caused by changes in threshold voltages of select transistors.

Referring to FIG. 10, the drain select transistor DST may control the amount of current IBL between the bit line BL and the memory cells, and the source select transistor SST may control the amount of current ISL between the source line SL and the memory cells MC. For example, when threshold voltages of the drain or source select transistors DST or SST are lower than a normal threshold voltage, the amount of current sensed from the memory cells during a sensing operation may be greater than a normal current amount. As a result, voltage levels lower than those of the actual threshold voltages of the memory cells may be sensed. On the other hand, when the threshold voltages of the drain or source select transistors DST or SST are greater than the normal threshold voltage, the amount of current sensed from the memory cells during a sensing operation may be lower than a normal current amount. As a result, voltage levels higher than those of the actual threshold voltages of the memory cells may be sensed.

In this embodiment, changes in threshold voltages of the drain and source select transistors DST and SST as described above may be checked, related information may be stored, and parameters may be controlled based on the stored information. In an embodiment, changes in threshold voltages of the drain and source select transistors DST and SST as described above may be checked to obtain a check result, status information of the check result may be stored, and various codes may be output to control various parameters based on the stored status information.

FIG. 11 is a diagram illustrating the configuration of the status manager 250 and a method of operating the same.

Referring to FIG. 11, the status manager 250 may include a status information register (SIR) 51, a status monitor 52, a cycling number register 53 and a counter 54.

The status information register 51 may store and update status information STIF received from a memory device. The status information STIF may correspond to information about threshold voltages of select transistors.

The status monitor 52 may output a setup signal SUS or a re-program signal REP according to the status information STIF received from the status information register 51. In an embodiment, the signals the status monitor 52 outputs in response to the status information STIF received from the status information register 51 may referred to as status signals. In an embodiment, the status signals may include at least one of a setup signal SUS and a re-program signal REP. The status monitor 52 may output status signals based on the number of select transistors having a changed threshold voltage as indicated by the status information STIF. The status monitor 52 may determine whether the number of select transistors whose threshold voltages are changed falls within an error correction range on the basis of codes output from the status information register 51. For example, the status monitor 52 may output the setup signal SUS for controlling parameters when the number of select transistors with the changed threshold voltages falls within the error correction range, and may output the re-program signal REP for performing re-program or setting a bad block when the number falls outside of the error correction range.

For example, when the number of select transistors whose threshold voltages are changed falls out of the error correction range, the status monitor 52 may determine whether the threshold voltages of the select transistors are increased or decreased on the basis of codes output from the status information register 51. The status monitor 52 may activate the re-program signal REP for re-programming the select transistors when the threshold voltages of the select transistors are decreased. On the other hand, when the threshold voltages of the select transistors are increased, the status monitor 52 may deactivate the re-program signal REP so as to process the corresponding memory block as a bad block. For example, a status where the re-program signal REP is at a high level is assumed as an active status, the status monitor 52 may activate the re-program signal REP when the number of select transistors whose threshold voltages are decreased falls within the error correction range.

The cycling number register 53 may count a cycling number of each of the memory blocks and store count information. For example, when erase and program commands are included in a command set CMDs output from the central processing unit 220, the cycling number register 53 may count a cycling number of a memory area corresponding to the commands included in the corresponding command set CMDs. For example, since a command and an address are included in the command set CMDs output by the central processing unit 220, the cycling number register 53 may store and update a cycling number in units of memory blocks according to the command set CMDs.

The counter 54 may receive a cycling number value CNV from the cycling number register 53. When a memory block of which the cycling number value CNV has reached a reference count value occurs, the counter 54 may output a trigger signal TSG for checking threshold voltages of select transistors of the corresponding memory block. In an embodiment, a cycling number may be changed by a value whenever a read operation, erase operation, or program operation on a memory block is performed. For example, a cycling number may be increased by a value (i.e., one) whenever an erase, read, or program operation on a memory block is performed. For example, a cycling number may be decreased by a value (i.e., one) whenever an erase, read, or program operation on a memory block is performed. For example, a cycling number may be increased by a value (i.e., one) whenever erase and program operations of a memory block are performed. The counter 54 may count a cycling number of a memory block and output the trigger signal TSG when the memory block with the counted value having reached the reference count value occurs. The reference count value may be set according to electrical characteristics of the memory device. For example, the reference count value may be set on the basis of time at which threshold voltages of select transistors are changed out of an allowable range in a test operation. Therefore, the reference count value may be set to a different value varying depending on a memory device.

The central processing unit 220 may output a check command set CHK_CMDs for checking threshold voltages of select transistors of a selected memory block in response to the trigger signal TGS. The check command set CHK_CMDs may include a read command and an address of select transistors.

The central processing unit 220 may output a setup command set SET_CMDs for changing a parameter of a selected memory block when receiving the setup signals SUS for changing parameters. The setup command set SET_CMDs may include a set feature command, an address of a target memory block, and a parameter change value.

The central processing unit 220 may output a re-program program command set RP_CMDs for increasing threshold voltages of select transistors of a selected memory block when receiving the re-program signals REP for performing a re-program (i.e., the activated re-program signal REP). The re-program command set RP_CMDs for a re-program may include a program command and an address of the select transistors that are to be re-programmed.

When receiving the deactivated re-program signal REP, the central processing unit 220 may output a bad block address B_ADD for processing the checked memory block as a bad block.

In the above-described embodiment, since a re-program operation or a bad block processing operation is performed according to a level at which the re-program signal REP is activated or deactivated, the re-program signal REP may be output through one node.

In an embodiment, a signal which is output during a bad block processing operation may be separately output through another node different from the node through which the re-program signal REP is output. For example, the status monitor 52 may include three output terminals, wherein the setup signal SUS, the re-program signal REP and a bad signal (not shown) may be output through the respective nodes. The central processing unit 220 may perform the bad block processing operation when the bad signal (not shown) is activated instead of the deactivated re-program signal REP.

The buffer memory 260 may temporarily store various types of information relating to operations of the memory system 1000. For example, the buffer memory 260 may include a logical address to physical address (L2P) register 61 and a physical address to logical address (P2L) register

62. The L2P register 61 may store address information including mapping a logical address to a physical address. The P2L register 62 may store address information including mapping a physical address to a logical address. In addition, the buffer memory 260 may store various types of information related to operations of the memory system 1000. The bad block address B_ADD output from the central processing unit 220 may be transferred to the buffer memory 260, and the addresses stored in the L2P register 61 and the P2L register 62 of the buffer memory 260 may be re-mapped according to the bad block address B_ADD. For example, an address of a memory block designated as a bad block may be changed to an address of a normal memory block, so that mapping between a logical address and a physical address may be changed. Data of the memory block designated as the bad block may be copied-back to another memory block according to the bad block address B_ADD stored in the buffer memory 260. The memory block designated as the bad block may be re-used as a normal memory block after an erase operation is performed.

The status information register 51 and the status monitor 52, among the above-described compositions, will be described below.

Figure 12:
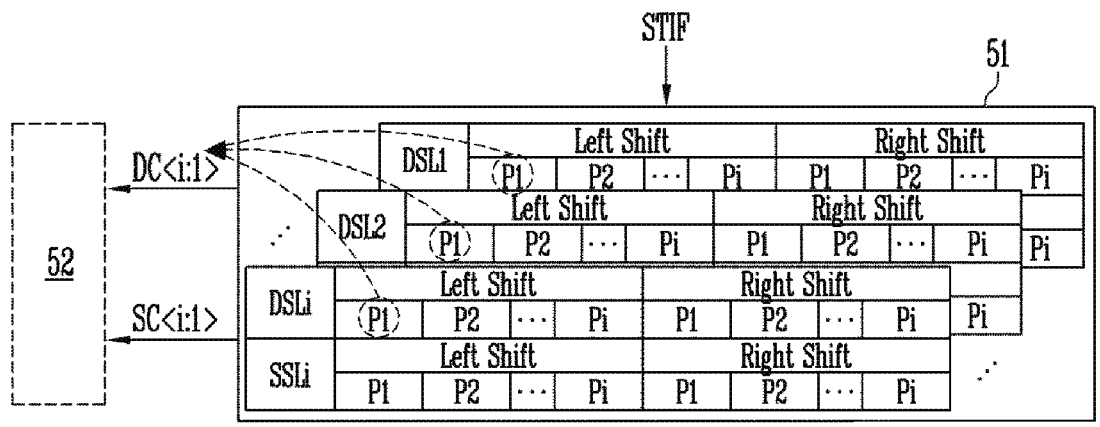
FIG. 12 is a diagram of a status information register of FIG. 11.

FIG. 12 is a diagram of the status information register 51 of FIG. 11.

Referring to FIG. 12, the status information register 51 may store information about changes in threshold voltages of the drain and source select transistors DST and SST according to addresses. For example, the status information register 51 may divide changes in threshold voltages of drain select transistors DST1 to DSTi and source select transistors SST1 to SSTi included in memory blocks of the planes P1 to Pi into a left shift value and a right shift value, and may store the divided values. The shift values of the threshold voltages of the drain and source select transistors DST1 to DSTi and SST1 to SSTi may be sequentially stored as the status information STIF in the status information register 51 in units of cell strings included in memory blocks according to the address in the check command set CHK_CMDs. For example, buffers included in the status information register 51 may be determined by the address included in the check command set CHK_CMDs, threshold voltage shift information of the drain select transistors DST1 to DSTi may be sequentially stored in designated buffers according to the input order, and threshold voltage shift information of the source select transistors SST1 to SSTi may be sequentially stored in the designated buffers.

For example, when the first plane P1 is selected according to the address included in the check command set CHK_CMDs, first data received by the status information register 51 may be stored in a left shift buffer of the first drain select line DSL1 of the first plane P1, second data may be stored in a right shift buffer of the first drain select line DSL1 of the first plane P1, third data may be stored in a left shift buffer of the first drain select line DSL1 of a second plane P2, and fourth data may be stored in a right shift buffer of the first drain select line DSL1 of the second plane P2. In this manner, the sequentially received data may be respectively stored in the designated buffers.

However, in addition to the above-described order, according to the setup of the memory device, the data received by the status information register 51 may be sequentially stored respectively in the assigned buffers in various manners. For example, when threshold voltages of selected drain or source select transistors included in a selected cell string, among cell strings included in a selected memory block of a selected plane are shifted to the left or right, a value of '1' may be stored in the corresponding buffer, and otherwise, a value of '0' may be stored in the corresponding buffer. For example, when a threshold voltage of the first drain select transistor DST1 included in the first cell string, among memory blocks of the first plane P1, is lowered, it may correspond to a left shift. Thus, a value of '1' may be stored in the corresponding buffer. Since drain and source select transistors may have different electrical characteristics, cell strings included in each of the memory blocks may have different electrical characteristics. For example, since the first drain select transistor DST1 included in the first plane P1 is physically different from the first drain select transistor DST1 included in the second plane P2, the first drain select transistors DST1 included in the first and second planes P1 and P2 may have different electrical characteristics.

Shift values of threshold voltages of drain select transistors of the same order in the same plane may be output as drain codes DC<i:1>, and shift values of threshold voltages of source select transistors may be output as source codes SC<i:1>, where 'i' is a positive integer. For example, the drain codes DC<i:1> of the first plane P1 may be output as left shift values or right shift values. The source codes SC<i:1> of the first plane P1 may be output as a left shift value or a right shift value of the first to ith source select transistors SST1 to SSTi.

The drain codes DC<i:1> and the source codes SC<i:1> may be transferred to the status monitor 52. The status monitor 52 may determine whether threshold voltages of drain and source select transistors included in memory blocks of each plane are increased or decreased.

A method of checking shift values of threshold voltages of drain or source select transistors will be described below.

Figure 13:
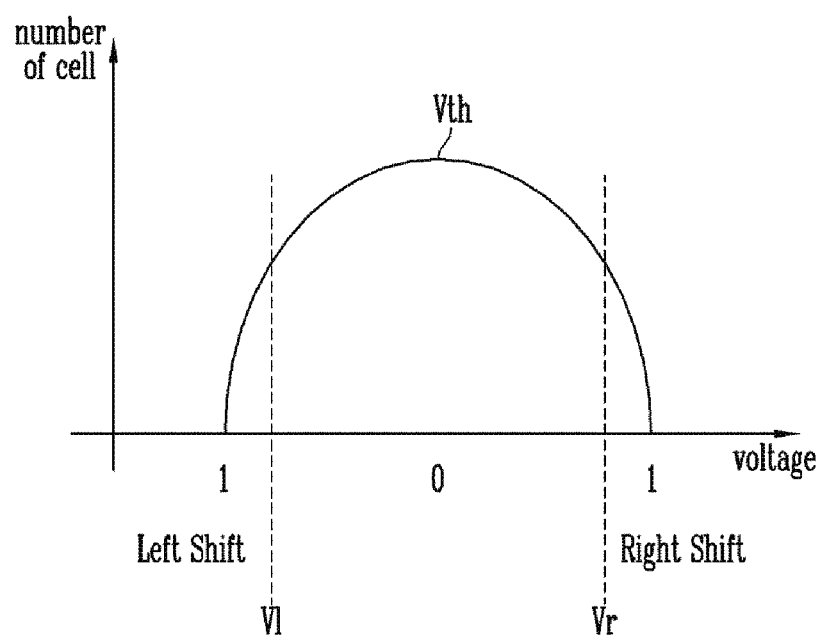
FIG. 13 is a diagram illustrating a method of checking threshold voltages of select transistors.

FIG. 13 is a diagram illustrating a method of checking threshold voltages of select transistors.

Referring to FIG. 13, a left reference voltage Vl and a right reference voltage Vr may be set to check whether threshold voltages Vth of drain and source select transistors are shifted. The left reference voltage Vl may be for checking whether a threshold voltage is decreased, and may be set to the same level as a verify target voltage of a program operation for increasing the threshold voltages of the select transistors. The right reference voltage Vr may be set to an average voltage of the highest voltage of a threshold voltage distribution of select transistors before threshold voltages are shifted.

When the threshold voltages Vth of the select transistors are measured to be lower than the left reference voltage Vl, a shift value may be '1'. When the threshold voltages Vth of the select transistors are measured to be higher than the left reference voltage Vl, the shift value may be '0'. In addition, when the threshold voltages Vth of the select transistors are measured to be higher than the right reference voltage Vr, a shift value may be '1'. When the threshold voltages Vth of the select transistors are measured to be higher than the right reference voltage Vr, the shift value may be '0'. In other words, when the threshold voltages Vth of the select transistors are increased or decreased, the shift value may be '1'. For example, when a left shift value checked with respect to a select transistor is '1' and a right shift value is '0', the status monitor 52 may determine that the threshold voltage Vth of the corresponding select transistor is lowered. For example, when the checked left shift value of the select transistor is '0' and the right shift value is '1', the status monitor 52 may determine that the threshold voltage Vth of the corresponding select transistor is increased. In an example, when the checked left shift value of the select transistor is '1' and the right shift value is also '1', the status monitor 52 may determine that a distribution of the threshold voltage Vth of the corresponding select transistor is widened overall. In an example, when the checked left shift value of the select transistor is '0' and the right shift value is also '0', the status monitor 52 may determine that the initial threshold voltage Vth distribution of the corresponding select transistor is maintained.

Figure 14:
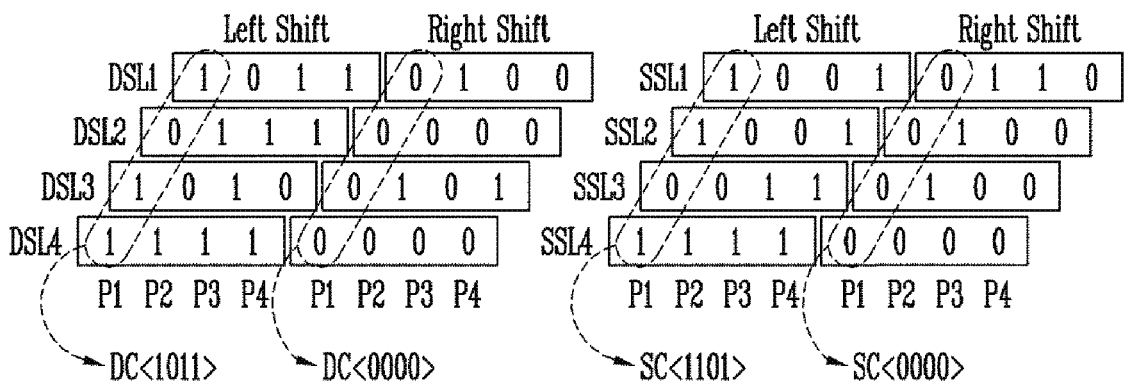
FIG. 14 is a diagram illustrating codes output from a status information register.

FIG. 14 is a diagram illustrating codes output from the status information register 51.

Referring to FIG. 14, the status information register 51 may store shift values of threshold voltages of drain and select transistors according to individual memory blocks included in a plane and may output shift values of the same plane as the drain codes DC<i:1> and the source codes SC<i:1>. As illustrated in FIG. 14, shift values may be stored in units of memory blocks included in the same plane. However, the shift values may be stored in various units including the select transistors.

As shown in the embodiment shown in FIG. 14, when drain select transistors coupled to the first drain select line DSL1 have a threshold voltage shift value of '1', drain select transistors coupled to the second drain select line DSL2 have a threshold voltage shift value of '0', drain select transistors coupled to a third drain select line DSL3 have a threshold voltage shift value of '1', and drain select transistors coupled to a fourth drain select line DSL4 have a threshold voltage shift value of '1', the drain codes DC<i:1> may be output as '1011'. In other words, in the drain codes DC<i:1> of the first plane P1, '1' may be a fail bit and '0' may be a pass bit. FIG. 14 illustrates the four drain select lines DSL1 to DSL4. However, actually, threshold voltage shift values of drain select transistors coupled to more drain select lines than the four drain select lines may be included. Therefore, a total number of bits of the drain codes DC<i:1> may be greater than four bits. In this manner, the source codes SC<i:1> may be output.

The drain codes DC<i:1> and the source codes SC<i:1> for the same plane may be output as a single group. For example, the drain codes DC<i:1> and the source codes SC<i:1> corresponding to the left shift values for the first plane P1 may be output as a single group to the status monitor 52, and the drain codes DC<i:1> and the source codes SC<i:1> corresponding to the right shift values for the first plane P1 may be output as another group to the status monitor 52.

The status monitor 52 may sequentially recognize the received group of the drain codes DC<i:1> and the source codes SC<i:1> and determine which plane the received codes are related to.

Figure 15:
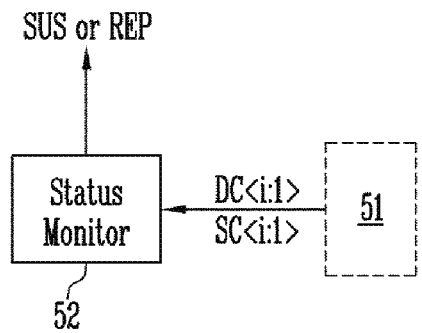
FIG. 15 is a diagram of a status monitor of FIG. 11.

FIG. 15 is a diagram of the status monitor 52 of FIG. 11.

Referring to FIG. 15, the status monitor 52 may determine shifts in threshold voltages of drain and source select transistors included in a selected plane on the basis of the number of fail bits included in the drain codes DC<i:1> and the source codes SC<i:1> received from the status information register 51. For example, when the number of fail bits included in the drain codes DC<i:1> and the source codes SC<i:1> is smaller than a predetermined number, the status monitor 52 may output the setup signal SUS for controlling a parameter of the selected plane. On the other hand, when the number of fail bits included in the drain codes DC<i:1> and the source codes SC<i:1> is greater than a predetermined number, the status monitor 52 may determine whether the left shift value or the right shift value has more fail bits than the predetermined number. For example, when the number of fail bits of the left shift value exceeds the predetermined number, the status monitor 52 may activate the re-program signal REP for re-programming the select transistors. On the other hand, when the number of fail bits of the right shift value exceeds the predetermined number, the status monitor 52 may deactivate the re-program signal REP so as to process the corresponding memory block as a bad memory block. The predetermined number may be a maximum allowable number by which error correction is enabled, and may vary depending on each memory system.

Figure 16:
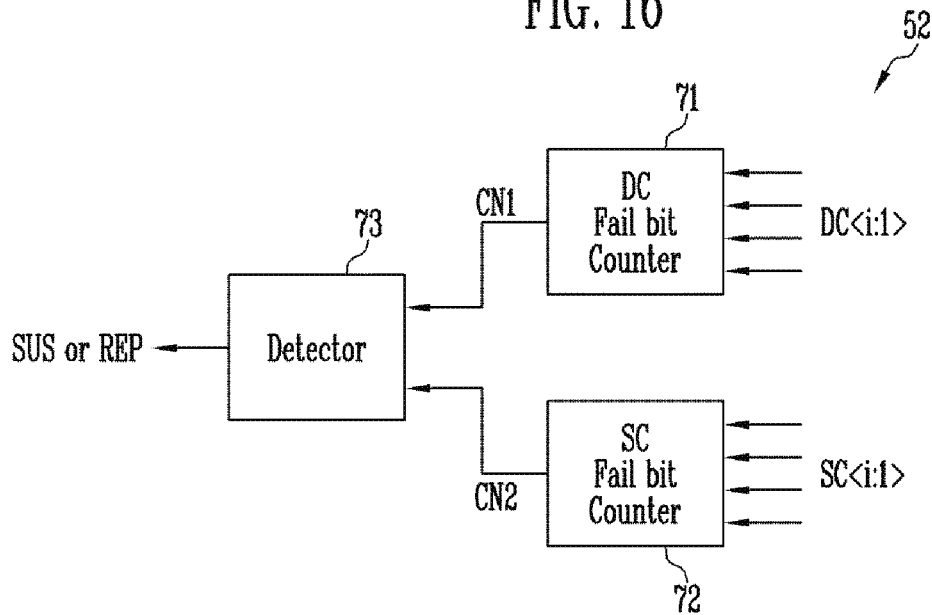
FIG. 16 is a diagram of an embodiment of a status monitor of FIG. 15.

FIG. 16 is a diagram of an embodiment of the status monitor 52 of FIG. 15.

Referring to FIG. 16, the status monitor 52 may include a drain code (DC) fail bit counter 71, a source code (SC) fail bit counter 72 and a detector 73.

The drain code fail bit counter 71 may count fail bits included in the drain codes DC<i:1> and output a first count value CN1. For example, when a fail bit is set to '1', the drain code fail bit counter 71 may count the number of '1' bits included in the drain codes DC<i:1> and output the first count value CN1 as a count result. The source code fail bit counter 72 may count the number of '1' bits included in the source codes SC<i:1> and output a second count value CN2 as a count value.

The detector 73 may analyze the first and second count values CN1 and CN2 and output the setup signal SUS, or the re-program signal REP by activating or deactivating the re-program signal REP. The detector 73 may divide the drain codes DC<i:1> and the source codes SC<i:1> for the left shift value from the drain codes DC<i:1> and the source codes SC<i:1> for the right shift value. For example, when the number of fail bits of the right shift value is greater than a predetermined number, the detector 73 may deactivate the re-program signal REP to process the corresponding block as a bad block regardless of the left shift value. When the number of fail bits of the right shift value is smaller than the predetermined value and the left shift value is greater than the predetermined number, the detector 73 may activate the re-program signal REP to re-program select transistors of the corresponding memory block. When both the right shift value and the left shift value are smaller than the predetermined number, the detector 73 may output the setup signal SUS. For example, when both the right shift value and the left shift value are smaller than the predetermined number, the detector 73 may output the setup signal SUS for re-setting the parameters of the corresponding memory block. In an embodiment, when both the right shift value and the left shift value are smaller than the predetermined number, the detector 73 may output the setup signal SUS for re-setting the parameters of the select transistors of the corresponding memory block. The detector 73 may output various setup signals SUS or the re-program signal REP through two output nodes.

Figure 17:
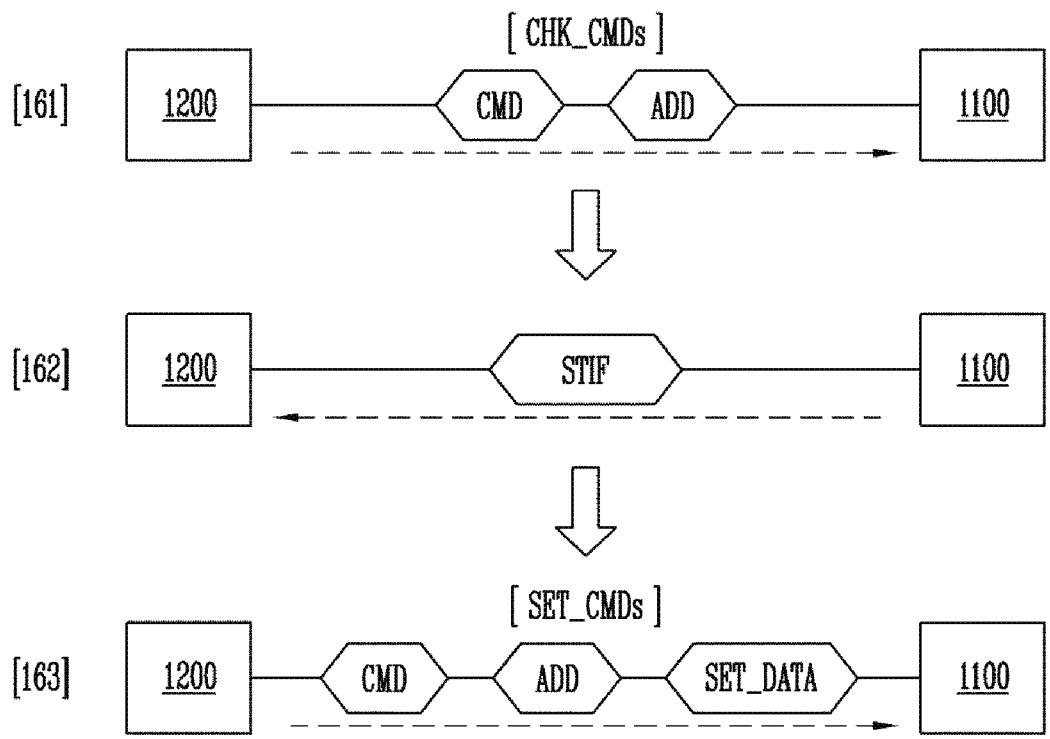
FIG. 17 is a diagram illustrating a method of transferring a command according to an embodiment of the present disclosure.

FIG. 17 is a diagram illustrating a method of transferring a command according to an embodiment of the present disclosure.

Referring to FIG. 17, when a cycling number of a selected plane or a selected memory block reaches a reference count value, the memory controller 1200 may transfer the check command set CHK_CMDs to the storage device 1100. The check command set CHK_CMDs may include the read command CMD and the address ADD (161).

The storage device 1100 may read select transistors of the selected plane or the selected memory block according to the read command CMD and the address ADD included in the check command set CHK_CMDs and may output the status information STIF including the read data to the memory controller 1200 (162).

The memory controller 1200 may store the status information STIF and transfer the setup command set SET_CMDs for controlling a parameter according to each plane or memory block to the storage device 1100 on the basis of the stored status information STIF. The setup command set SET_CMDs may include setup data SET_DATA about the command CMD for changing a parameter, the address ADD of a plane or a memory block, and a parameter change value (163).

In response to the setup command set SET_CMDs, the storage device 1100 may re-set a parameter value of the selected plane or the selected memory block and perform subsequent operations according to the re-set parameter value. Parameters may include information as below.

TABLE 1

| Parameter | Value |
| --- | --- |
| DST_Left | Vdlr [V] |
| DST_Right | Vdrr [V] |
| SST_Left | Vslr [V] |
| SST_Right | Vsrr [V] |
| DST_Left_CSC | Adlr [number] |
| DST_Right_CSC | Adrr [number] |
| SST_Left_CSC | Aslr [number] |
| SST_Right_CSC | Asrr [number] |
| ... | ... |

Referring to Table 1, 'DST_Left' may refer to a low level of a threshold voltage distribution of a drain select transistor and 'Vdlr' may be set for this value. Vdlr may refer to a voltage for checking a low threshold voltage of the drain select transistor. 'DST_Right' may refer to a high level of the threshold voltage distribution of the drain select transistor, and 'Vdrr' may be set for this value. Vdrr may refer to a voltage for checking a high threshold voltage of the drain select transistor. 'SST_Left' may refer to a low level of a threshold voltage distribution of a source select transistor and 'Vslr' may be set for this value. Vslr may refer to a voltage for checking a low threshold voltage of the source select transistor. 'SST_Right' may refer to a high level of the threshold voltage distribution of the source select transistor, and Vsrr may be set for this value. Vsrr may refer to a voltage for checking a high threshold voltage of the source select transistor.

'DST_Left_CSC' may refer to a predetermined number with respect to a left shift value of the drain select transistor, and 'Adlr' may be set for this value. Adlr may refer to an allowable number for checking error correction on a low threshold voltage shift value of the drain select transistor. 'DST_Right_CSC' may refer to a predetermined number for a right shift value of the drain select transistor, and 'Adrr' may be set for this value. Adrr may refer to an allowable number for checking error correction on a high threshold voltage shift value of the drain select transistor. 'SST_Left_CSC' may refer to a predetermined number for a left shift value of the source select transistor, and Aslr may be set for this value. Aslr may refer to an allowable number for checking error correction on a low threshold voltage shift value of the source select transistor. 'SST_Right_CSC' may refer to a predetermined number for a right shift value of the source select transistor, and 'Asrr' may be set for this value. Asrr may refer to an allowable number for checking error correction on a high threshold voltage shift value of the source select transistor.

In addition to the above parameters as shown in 'Table 1', values such as various voltages necessary for a program, read or erase operation, and an operation time may be stored. The memory device may perform program, read and erase operations according to the set parameter.

Figure 18:
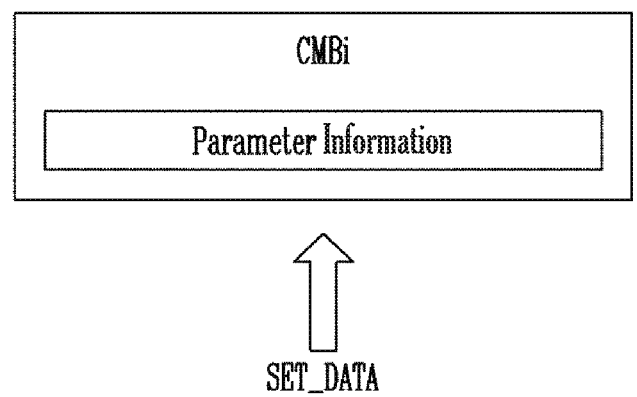
FIG. 18 is a diagram illustrating a CAM memory block in which parameter information is stored.

FIG. 18 is a diagram illustrating a CAM memory block in which parameter information is stored.

Referring to FIG. 18, the parameter information as shown in 'Table 1' may be stored in some of the memory blocks included in the storage device 1100. For example, the parameter information may be stored in the ith CAM memory block CMBi storing system data necessary for operations of the memory system 1000.

The storage device 1100 may store the received setup data SET_DATA included in the setup command set SET_CMDs in the ith CAM memory block CMBi. The parameter information stored in the ith CAM memory block CMBi may be output when a get feature command is received from the memory controller 1200. The memory controller 1200 may control the storage device 1100 on the basis of the received parameter information.

An operating method using the above-described devices will be described below.

Figure 19:
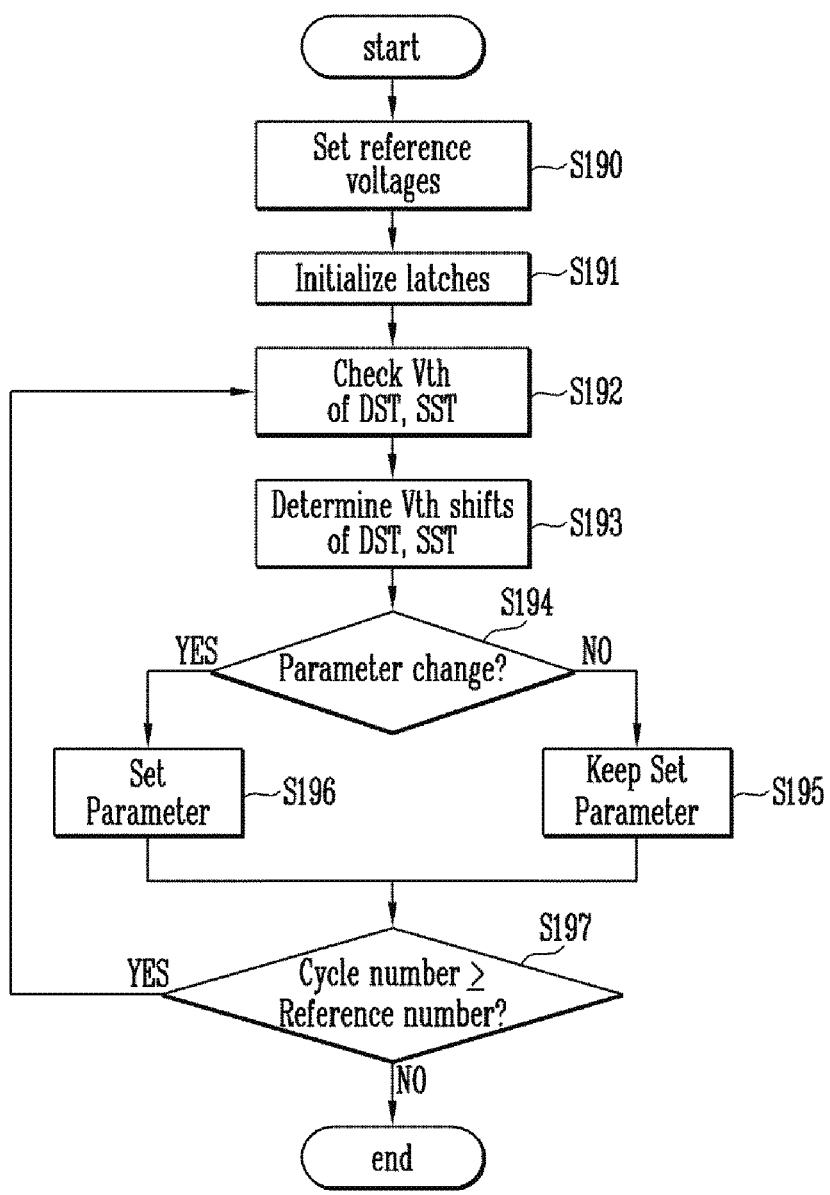
FIG. 19 is a flowchart illustrating a method of operating a memory system according to a first embodiment of the present disclosure.

FIG. 19 is a diagram illustrating an embodiment of a memory system according to the present disclosure.

In FIG. 19, a description will be made on the basis of a memory block whose a cycling number has reached a reference count value.

Referring to FIG. 19, a memory device including the memory block whose the cycling number has reached the reference count value may set reference voltages for checking threshold voltages of select transistors in response to a setup command (S190). For example, when the memory device including the memory block whose the cycling number having reached the reference count value is detected, a memory controller may transfer the setup command to the detected memory device. In response to the setup command, the memory device may set the reference voltages for checking the threshold voltages of the select transistors. For example, the reference voltages may include a left reference voltage and a right reference voltage.

When the reference voltages are set up, the memory device may initialize latches included in page buffers (S191). For example, the threshold voltages of the select transistors may be checked through a read operation. To perform the read operation, since some of the latches included in the page buffers may be necessarily initialized, the memory device may initialize some of the latches included in the page buffers. For example, the memory device may initialize latches used to perform a read or verify operation, among the latches included in each of the page buffers.

The memory controller may transfer a check command set to a selected memory device, and the selected memory device may check the threshold voltages Vth of the drain and source select transistors DST and SST included in the selected memory block according to the received check command set (S192). Information about the checked threshold voltages may be output as status information to the memory controller and stored in the memory controller.

Based on the status information stored in the memory controller, threshold voltage (Vth) shifts of the drain and source select transistors DST and SST of the selected memory block may be determined (S193).

As a result of determination (S194), when there is no need to change a parameter (NO), parameter setting for the selected memory block may be maintained (S195).

As the result of determination (S194), when the parameter needs to be changed (YES), the parameter setting for the selected memory block may be re-set (S196).

When the parameter is maintained (S195) or reset (S196), normal operations (e.g., a program, read or erase operation) on the selected memory block may be performed.

When an erase operation and a program operation are performed on the selected memory block, a cycling number of the selected memory block may be increased.

The memory controller may monitor the cycling number of the selected memory block and determine whether the cycling number is greater than or equal to the reference count value (S197). When the cycling number of the selected memory block is smaller than the reference count value (NO), a parameter setting operation of the selected memory block may be terminated. When the cycling number of the selected memory block is greater than or equal to the reference count value, some steps S192 to S197 may be repeated.

The above-described steps are described below.

Figure 20:
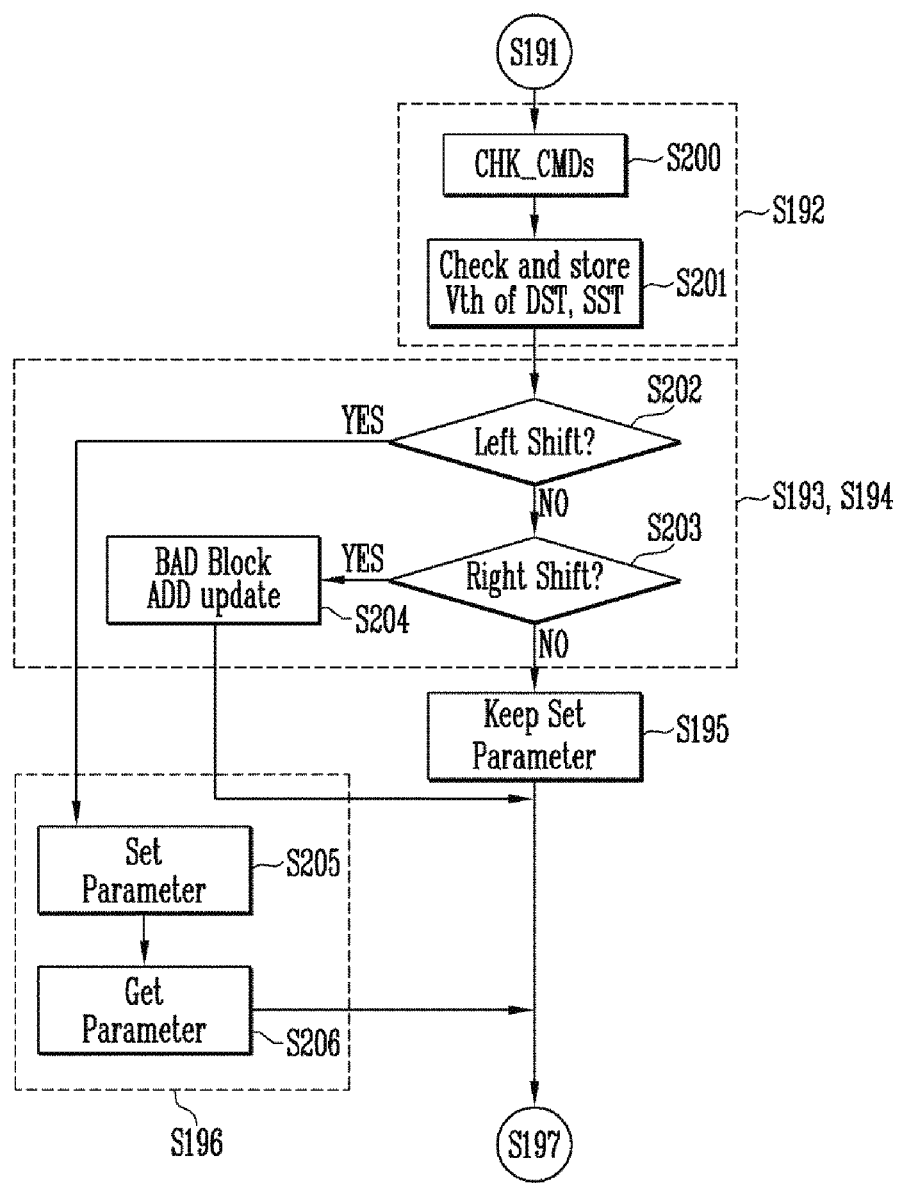
FIG. 20 is a flowchart illustrating some of the steps of FIG. 19 in more detail.

FIG. 20 is a flowchart illustrating some of the steps of FIG. 19.

Referring to FIG. 20, the memory controller may transfer the check command set CHK_CMDs to the selected memory device at step S192 (S200). The check command set CHK_CMDs may include a read command and an address of the select transistors.

The memory device receiving the check command set CHK_CMDs may check threshold voltages of the drain and source select transistors DST and SST of the selected memory block according to the received address, and the memory controller may store information about the checked threshold voltages as status information (S201).

At steps S193 and S194, the memory controller may determine whether the threshold voltages of the drain and source select transistors are decreased or increased on the basis of the status information. For example, the memory controller may determine whether the threshold voltages of the drain and source select transistors are decreased (S202). When it is determined that the threshold voltages of the drain and source select transistors are not decreased (NO at step S202), the memory controller may determine whether the threshold voltages are increased (S203).

At step S203, when it is determined that the threshold voltages of the drain and source select transistors are increased (YES at step S203), the memory controller may update a bad block address to process the selected memory block as a bad block (S204). When the selected memory block is updated as the bad block, step S197 may be performed. Since step S197 is described in FIG. 19, a description thereof will be omitted.

At step S202, when the number of select transistors whose threshold voltages have been reduced to less than a reference voltage is smaller than a predetermined number (YES at step S202), the memory controller may transfer a re-program command set to the memory device, and the memory device may perform a program operation for increasing threshold voltages of the drain and source select transistors DST and SST in response to a program command and an address included in the re-program command set. For example, the program operation for increasing the threshold voltages of the drain and source select transistors DST and SST may be performed to increase the threshold voltages of the drain and source select transistors by applying at least one program voltage to the drain and source select lines DSL and SSL. In an embodiment, the program operation for increasing the threshold voltages of the drain and source select transistors DST and SST may be performed to increase the threshold voltages of the drain and source select transistors by applying a program voltage at least once to the drain and source select line DSL or SSL.

When the program operation of the drain and source select transistors DST and SST having the decreased threshold voltages is completed, the memory controller may re-set a parameter by transferring a set feature command to the memory device (S205) and receive the re-set parameter from the memory device by using a get feature command (S206). Step S197 may be performed after step S206.

When it is determined that the threshold voltages are not increased at step S203 (NO), the memory controller may maintain the parameter of the selected memory block (S195). Step S197 may be performed.

Among the above-described steps, step S201 will be described below.

Figure 21:
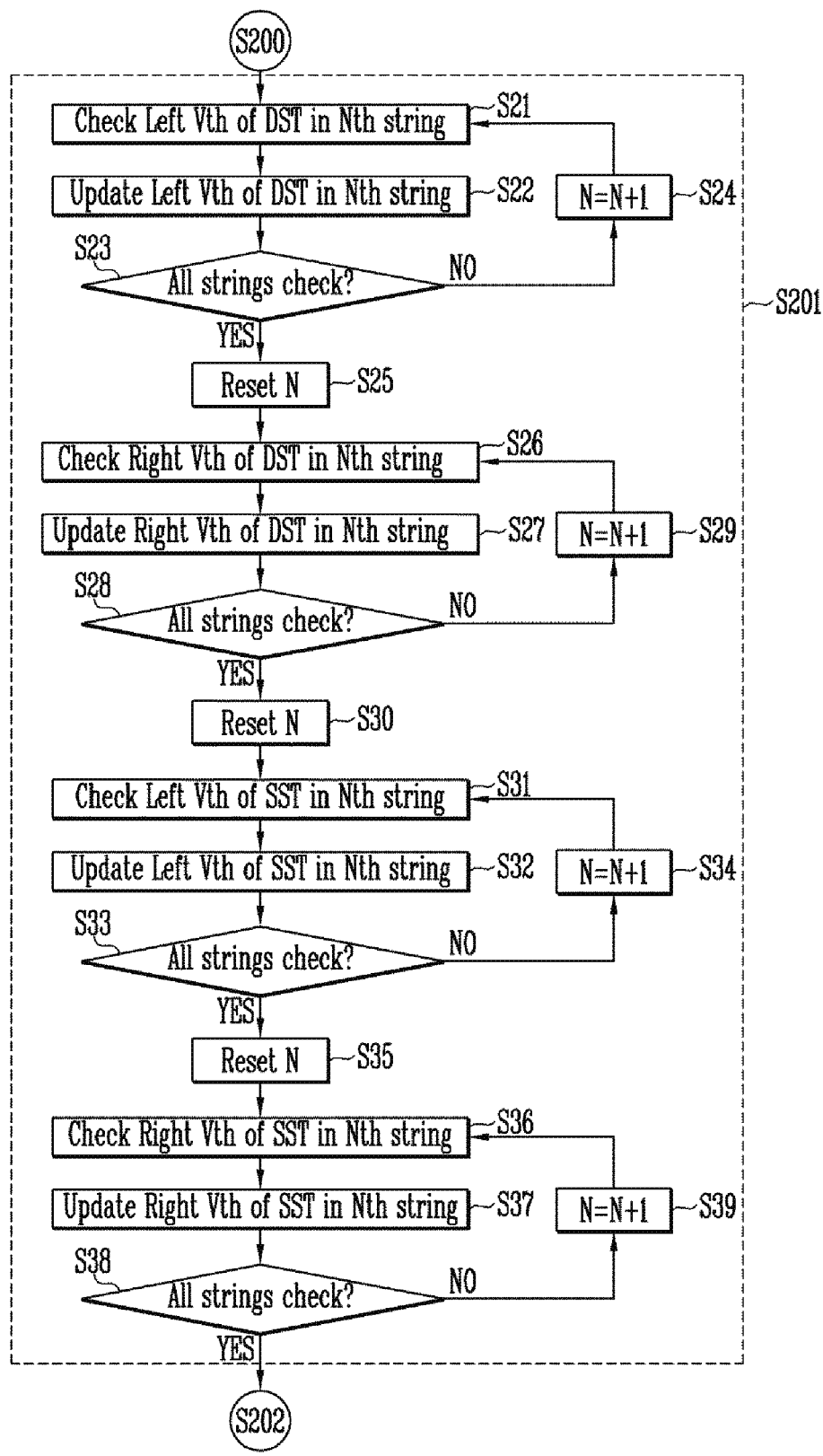
FIG. 21 is a detailed flowchart illustrating a method of checking and storing threshold voltages of select transistors of FIG. 20.

FIG. 21 is a detailed flowchart illustrating a method of checking and storing threshold voltages of select transistors of FIG. 20.

Referring to FIG. 21, when the check command set is received from the memory controller (S200), the memory device may perform read operations to determine whether threshold voltages of the drain select transistors DST are decreased or increased, and may perform read operations to determine whether threshold voltages of the source select transistors SST are decreased or increased.

For example, the memory device may read the drain select transistors of the selected memory block by using a left reference voltage in response to a first check command set and may output the read threshold voltage information to the memory controller. The memory device may read the drain select transistors of the selected memory block by using a right reference voltage in response to a second check command set and may output the read threshold voltage information to the memory controller. The left reference voltage may be for determining whether the threshold voltages of the select transistors are decreased and the right reference voltage may be for increasing the threshold voltages of the select transistors. The memory device may read the source select transistors of the selected memory block by using the left reference voltage in response to a third check command set and may output the read threshold voltage information to the memory controller. The memory device may read the source select transistors of the selected memory block by using the right reference voltage in response to a fourth check command set and may output the read threshold voltage information to the memory controller. The memory controller may determine whether the threshold voltages of the select transistors are decreased, increased, or maintained at an initial state on the basis of the threshold voltage information received from the memory device.

In an embodiment of FIG. 21, the threshold voltages of the source select transistors SST may be read after the threshold voltages of the drain select transistors DST are read. However, the above-described read order may be changed. The operation of reading the threshold voltages of the drain and source select transistors DST and SST will be described below.

The memory system may check a left threshold voltage Vth of the drain select transistor DST included in an Nth cell string of the selected memory block by using the first check command set (S21). For example, the memory controller may output the first check command set. The memory device may read the drain select transistor DST included in the Nth cell string, among a plurality of cell strings included in the selected memory block, and may output the read information to the memory controller in response to the first check command set.

The memory controller may update the left threshold voltage information of the drain select transistor DST of the Nth cell string on the basis of the read information received from the memory device (S22). The memory controller may determine whether a check operation on all cell strings of the selected memory block is performed (S23).

At step S23, when it is determined that the check operation on all cell strings of the selected memory block is not completed (NO at step S23), the memory controller may increase a value N by one (S24) and re-transfer the first check command set to the memory device. In this manner, steps S21 to S24 may be repeated until left threshold voltages of the drain select transistors DST included in all cell strings of the selected memory block are checked.

At step S23, when it is determined that the check operation on all cell strings of the selected memory block is completed (YES at step S23), the memory controller may reset the value N (S25).

When the left threshold voltages of all drain select transistors of the selected memory block are checked, the memory system may check right threshold voltages (Vth) of the drain select transistors DST included in the Nth cell string in the selected memory block (S26). For example, the memory controller may output a second check command set. The memory device may read the drain select transistor DST included in the Nth cell string, among the plurality of cell strings included in the selected memory block, and may output the read information to the memory controller in response to the second check command set.

The memory controller may update the right threshold voltage information of the drain select transistor DST of the Nth cell string on the basis of the read information received from the memory device (S27). The memory controller may determine whether a check operation on all cell strings of the selected memory block is performed (S28).

At step S28, when it is determined that the check operation on all cell strings of the selected memory block is not completed (NO at step S28), the memory controller may increase the value N by one (S29) and re-transfer the second check command set to the memory device. In this manner, steps S26 to S29 may be repeated until right threshold voltages of the drain select transistors included in all cell strings of the selected memory block are checked.

At step S28, when it is determined that the check operation on all cell strings of the selected memory block is completed (YES at step S28), the memory controller may reset the value N (S30) and output a third check command set.

The memory system may check a left threshold voltage Vth of the source select transistor SST included in the Nth cell string of the selected memory block by using the third check command set (S31). For example, the memory controller may output a third check command set. The memory device may read the source select transistor SST included in the Nth cell string, among a plurality of cell strings included in the selected memory block, and may output the read information to the memory controller in response to the third check command set.

The memory controller may update the left threshold voltage information of the source select transistor SST of the Nth cell string on the basis of the read information received from the memory device (S32). The memory controller may determine whether a check operation on all cell strings of the selected memory block is performed (S33).

At step S33, when it is determined that the check operation on all cell strings of the selected memory block is not completed (NO at step S33), the memory controller may increase the value N by one (S34) and re-transfer the third check command set to the memory device. In this manner, steps S31 to S34 may be repeated until left threshold voltages of the source select transistors SST included in all cell strings of the selected memory block are checked.

At step S33, when it is determined that the check operation on all cell strings of the selected memory block is completed (YES at step S33), the memory controller may reset the value N (S35).

When the left threshold voltages of all drain select transistors of the selected memory block are checked, the memory system may check right threshold voltages (Vth) of the source select transistors SST included in the Nth cell string in the selected memory block (S36). For example, the memory controller may output a fourth check command set. The memory device may read the source select transistor SST included in the Nth cell string, among a plurality of cell strings included in the selected memory block, and may output the read information to the memory controller in response to the fourth check command set.

The memory controller may update the right threshold voltage information of the source select transistor SST of the Nth cell string on the basis of the read information received from the memory device (S37). The memory controller may determine whether a check operation on all cell strings of the selected memory block is performed (S38).

At step S38, when it is determined that the check operation on all cell strings of the selected memory block is not completed (NO at step S38), the memory controller may increase the value N by one (S39) and re-transfer the fourth check command set to the memory device. In this manner, steps S36 to S39 may be repeated until right threshold voltages of the drain select transistors included in all cell strings of the selected memory block are checked.

At step S38, when it is determined that the check operation of all cell strings of the selected memory block is completed (YES at S38), the threshold voltage check and update operations of the select transistors may be completed.

As described above, the memory controller may store and update the information about the threshold voltages of the select transistors and control the memory device using the information, so that reliability of the memory system may be improved.

Figure 22:
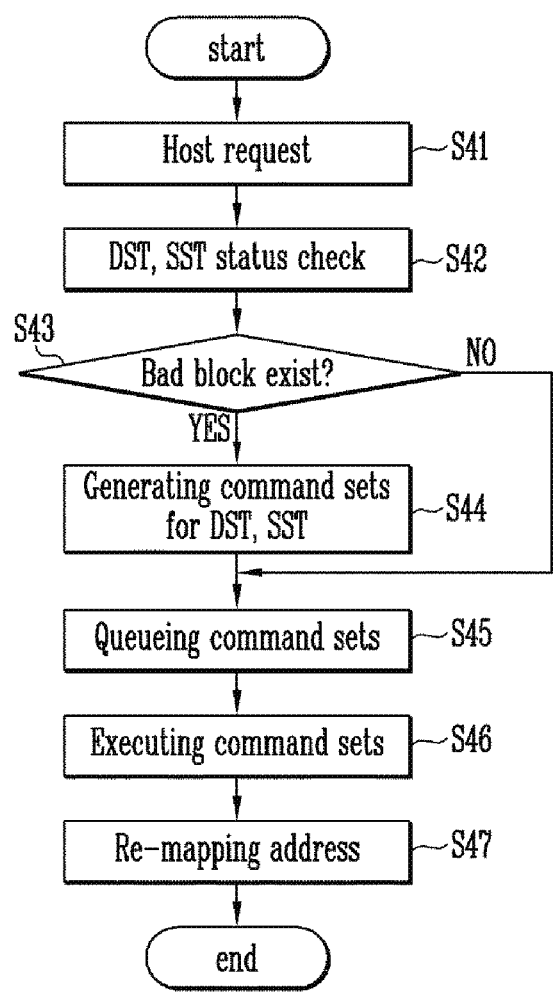
FIG. 22 is a flowchart illustrating a method of operating a memory system according to another embodiment of the present disclosure.

FIG. 22 is a flowchart illustrating a method of operating a memory system according to another embodiment of the present disclosure.

Referring to FIG. 22, when a memory controller receives a status check request from a host (S41), the memory controller may check statuses of select transistors included in a selected memory block of a selected memory device (S42). However, even in the absence of a request from the host (S41), the memory controller may check the statuses of the select transistors. The select transistors may be the drain select transistors DST and the source select transistors SST.

Since a method of storing status information of the select transistors in the memory controller is described in the first embodiment as described above, a description thereof will be omitted.

As a check result (S43), when it is determined that a bad block exists in the selected memory block (YES), the memory controller may generate a bad block replacement command set by the drain and source select transistors DST and SST (S44). When the replacement command set is generated, the memory block may queue replacement command sets along with the previously queued command sets (S45).

As the check result (S43), when it is determined that the bad block is not present in the selected memory device (NO), the memory controller may queue previously generated command sets without generating a replacement command set (S45).

The queued command sets may be sequentially executed (S46). When a replacement command set is included in the queued command sets, the selected memory device may replace the bad block with a normal block in response to the replacement command set. In other words, when the memory blocks are three-dimensionally structured, the select transistors may have the same or similar structure to the memory cells. In this structure, threshold voltages of the select transistors may be changed in the same manner as the memory cells. Therefore, in this embodiment, a memory block may be processed as a bad block according to the threshold voltages of the select transistors.

When the bad block is replaced by a normal block, the memory controller may remap a physical address of the bad block to a physical address of the newly replaced normal block.

Figure 23:
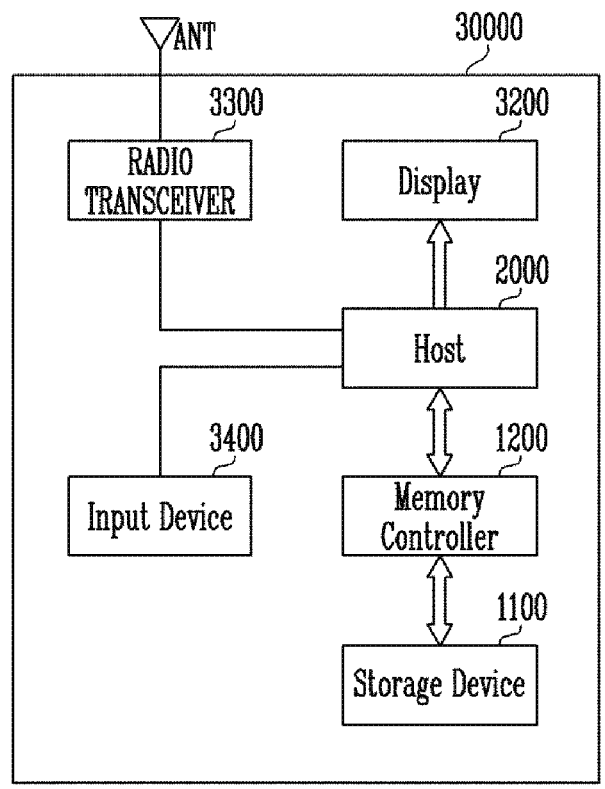
FIG. 23 is a diagram illustrating another embodiment of a memory system including a memory controller shown in FIG. 1 or 2.

FIG. 23 is a diagram illustrating another embodiment of a memory system 30000 including the memory controller 1200 shown in FIG. 1 or 2.

Referring to FIG. 23, the memory system 30000 may be embodied into a cellular phone, a smart phone, a tablet PC, a personal digital assistant (PDA), or a wireless communication device, etc.

The memory system 30000 may include the storage device 1100 and the memory controller 1200 controlling the operations of the storage device 1100. The memory controller 1200 may control a data access operation of the storage device 1100, for example, a program operation, an erase operation or a read operation of the storage device 1100 in response to control of the host 2000.

The memory controller 1200 may control data programmed into the storage device 1100 to be output through a display 3200.

A radio transceiver 3300 may exchange a radio signal through an antenna ANT. For example, the radio transceiver 3300 may change the radio signal received through the antenna ANT into a signal which can be processed by the host 2000. Therefore, the host 2000 may process the signal output from the radio transceiver 3300 and transfer the processed signal to the memory controller 1200 or the display 3200. The memory controller 1200 may transfer the signal processed by the host 2000 into the storage device 1100. In addition, the radio transceiver 3300 may change a signal output from the host 2000 into a radio signal and output the radio signal to an external device through the antenna ANT. A control signal for controlling the operations of the host 2000 or data to be processed by the host 2000 may be input by an input device 3400, and the input device 3400 may include a pointing device, such as a touch pad and a computer mouse, a keypad, or a keyboard. The host 2000 may control the operations of the display 3200 so that data output from the memory controller 1200, data output from the radio transceiver 3300, or data output from an input device 3400 may be output through the display 3200.

Figure 24:
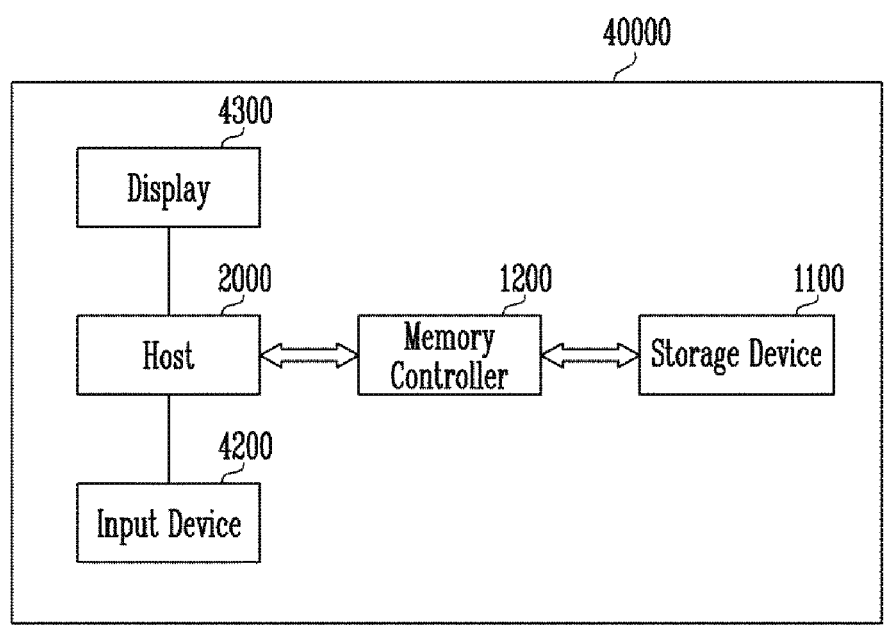
FIG. 24 is a diagram illustrating another embodiment of a memory system including a memory controller shown in FIG. 1 or 2.

FIG. 24 is a diagram illustrating an embodiment of the memory system 1000 including the memory controller 1200 shown in FIG. 1 or 2.

Referring to FIG. 24, a memory system 40000 may be provided as a personal computer (PC), a tablet PC, a net-book, an e-reader, a personal digital assistant (PDA), a portable multimedia player (PMP), an MP3 player, or an MP4 player.

The memory system 40000 may include the storage device 1100 and the memory controller 1200 controlling a data processing operation of the storage device 1100.

The host 2000 may output data stored in the storage device 1100 through a display 4300 according to data input through an input device 4200. Examples of the input device 4200 may include a pointing device such as a touch pad or a computer mouse, a keypad, or a keyboard.

The host 2000 may control various operations of the memory system 40000 and control operations of the memory controller 1200.

Figure 25:
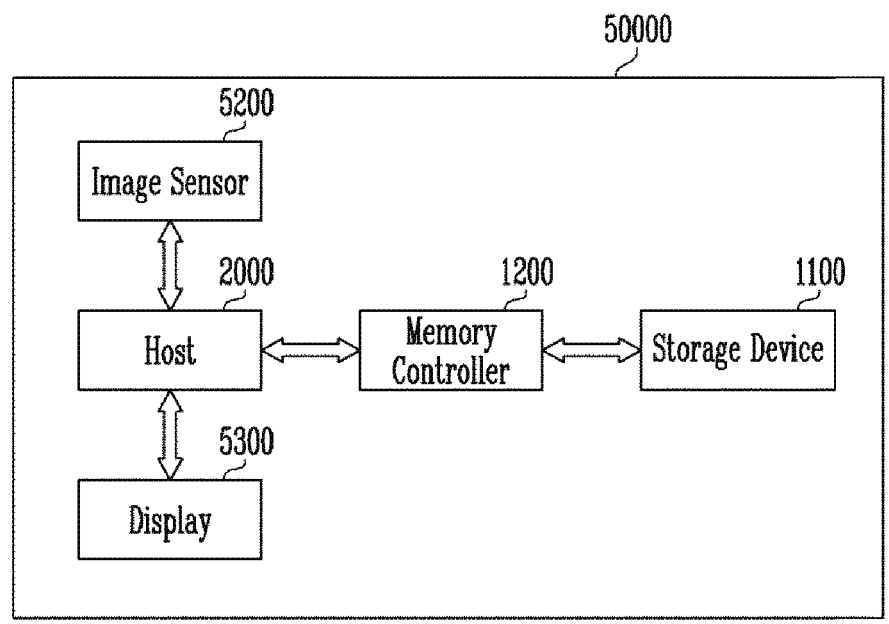
FIG. 25 is a diagram illustrating another embodiment of a memory system including a memory controller shown in FIG. 1 or 2.

FIG. 25 is a diagram illustrating an embodiment of the memory system 1000 including the memory controller 1200 shown in FIG. 1 or 2.

Referring to FIG. 25, a memory system 50000 may be embodied into an image processor, for example, a digital camera, a cellular phone with a digital camera attached thereto, a smartphone with a digital camera attached thereto, or a table PC with a digital camera attached thereto, etc.

The memory system 50000 may include the storage device 1100 and the memory controller 1200 controlling a data processing operation of the storage device 1100, for example, a program operation, an erase operation or a read operation.

An image sensor 5200 of the memory system 50000 may convert an optical image into digital signals, and the converted digital signals may be transferred to the host 2000. In response to control of the host 2000, the converted digital signals may be output through a display 5300 or stored in the storage device 1100 through the memory controller 1200. In addition, the data stored in the storage device 1100 may be output through a display 5300 according to control of the host 2000.

Figure 26:
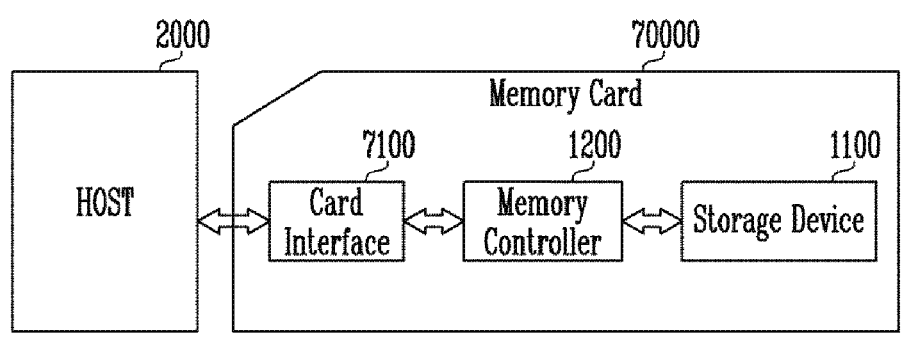
FIG. 26 is a diagram illustrating another embodiment of a memory system including a memory controller shown in FIG. 1 or 2.

FIG. 26 is a diagram illustrating an embodiment of the memory system 1000 including the memory controller 1200 shown in FIG. 1 or 2.

Referring to FIG. 26, the memory system 1000 may include the host 2000 and a memory card 70000.

The memory card 70000 may be embodied into a smart card. The memory card 70000 may include the storage device 1100, the memory controller 1200 and a card interface 7100.

The memory controller 1200 may control data exchange between the storage device 1100 and the card interface 7100. According to an embodiment, the card interface 7100 may be, but not limited thereto, a secure digital (SD) card interface or a multi-media card (MMC) interface. In addition, the card interface 7100 may interface data exchange between the host 2000 and the memory controller 1200 according to a protocol of the host 2000. According to an embodiment, the card interface 7100 may support a Universal Serial Bus (USB) protocol and an InterChip (IC)-USB protocol. The card interface 7100 may refer to hardware that supports a protocol used by the host 2000, software mounted on the hardware, or a signal transmission method.

According to the present disclosure, threshold voltages of select transistors may be detected and stored and parameters for various operations may be controlled on the basis of the stored information, so that reliability of a memory system may be improved.

While the examples of embodiments of the present disclosure have been disclosed for illustrative purposes, those skilled in the art will appreciate that various modifications, additions and substitutions are possible.

What is claimed is:

1. A memory system, comprising:
a status information register configured to check threshold voltages of select transistors included in memory blocks, store status information of a check result, and output a code based on the status information;
a status monitor configured to receive the code from the status information register, determine a number of select transistors that have shifted in a memory block according to the code, and output status signals based on the number of the select transistors that have shifted; and
a central processing unit configured to output a setup command set for setting parameters of the memory block, output a re-program command set for re-programming select transistors of the memory block, or output a bad block address for processing the memory block as a bad block in response to the status signals.

2. The memory system of claim 1, wherein the status information register divides information about left shift values of the threshold voltages of the select transistors from information about right shift values of the threshold voltages and stores the information about the left and right shift values.

3. The memory system of claim 2, wherein the status information register stores the information about the left shift values of the threshold voltages of the select transistors in a left shift buffer and stores the information about the right shift values of the threshold voltages of the select transistors in a right shift buffer.

4. The memory system of claim 2, wherein the status information register outputs the code as values for a selected memory block, among the right shift values, and outputs the code as values for the selected memory block, among the left shift values, after the code for the right shift values is completely output.

5. The memory system of claim 4, wherein when a number of the right shift values is greater than a predetermined number the status monitor outputs the status signals to the central processing unit, to output the bad block address for processing the memory block as a bad block, regardless of the left shift value.

6. The memory system of claim 1, wherein the status monitor outputs the status signals by determining whether the threshold voltages of the select transistors are decreased, increased, or maintained according to the code.

7. The memory system of claim 6, wherein the status monitor outputs signals for re-setting a parameter of a memory block as the status signals when a number of select transistors having reduced threshold voltages is less than a predetermined number, and outputs signals for re-programming the select transistors as the status signals when the number of select transistors having the reduced threshold voltages is greater than or equal to the predetermined number.

8. The memory system of claim 7, wherein the central processing unit outputs the setup command set when receiving the status signals for re-setting the parameter of the memory block, and outputs the re-program command set when receiving the status signals for re-programming the select transistors.

9. The memory system of claim 7, wherein the status monitor outputs signals for the re-setting of the parameter of the memory block as the status signals when the number of select transistors having increased threshold voltages is less than a predetermined number.

10. The memory system of claim 7, wherein the status monitor outputs signals for the re-programming of the select transistors as the status signals when the number of select transistors having increased threshold voltages is less than a predetermined number.

11. The memory system of claim 6, wherein the status monitor outputs signals for processing the memory block as a bad block when it is determined that the threshold voltages of the selected transistors are increased.

12. The memory system of claim 1, further comprising:
a cycling number register storing a cycling number of the memory block; and
a counter detecting a memory block of which the cycling number stored in the cycling number register equals a reference count value, and outputting a trigger signal for checking threshold voltages of select transistors included in a detected memory block when the stored cycling number equals the reference count value.

13. The memory system of claim 12, wherein the central processing unit outputs a check command set for checking the threshold voltages of the select transistors included in the detected memory block when receiving the trigger signal.

14. The memory system of claim 12, wherein the cycling number is changed whenever an erase or program operation is performed on the memory block.

15. A method of operating a memory system, the method comprising:
checking threshold voltages of select transistors;
storing status information about the threshold voltages;
outputting codes, including bits that are grouped in units corresponding to memory blocks, included in the status information;
determining shift statuses of the select transistors according to the codes; and
performing a re-programming of select transistors of a memory block based on the shift statuses of the select transistors, a re-setting of a parameter of a memory block based on the shift statuses of the select transistors, and a processing of a memory block as a bad block based on the shift statuses of the select transistors.

16. The method of claim 15, wherein the checking of the threshold voltages of the select transistors comprises reading with the select transistors by using a read command and an address of the select transistors.

17. The method of claim 16, wherein read data is divided according to types of the select transistors of the memory block, a left shift and a right shift.

18. The method of claim 17, wherein the outputting of the codes including the bits that are grouped in units corresponding to memory blocks comprises outputting values for the left shift and values for the right shift as different codes in the status information of a same memory block of the corresponding memory blocks.

19. The method of claim 15, wherein signals for re-programming the select transistors are output when a number of select transistors having reduced threshold voltages is greater than or equal to a predetermined number,
signals for re-setting a parameter of the memory block are output when the number of select transistors having the reduced threshold voltages is less than the predetermined number, and
an address of the memory block is output as a bad block address to process the memory block as a bad block when the threshold voltages of the select transistors are increased.

* * * * *